US010957818B2

(12) United States Patent
Ahmed

(10) Patent No.: US 10,957,818 B2
(45) Date of Patent: Mar. 23, 2021

(54) HIGH PERFORMANCE LIGHT EMITTING DIODE AND MONOLITHIC MULTI-COLOR PIXEL

(71) Applicant: INTEL CORPORATION, Santa Clara, CA (US)

(72) Inventor: Khaled Ahmed, Anaheim, CA (US)

(73) Assignee: Intel Corporation, Santa Clara, CA (US)

( * ) Notice: Subject to any disclaimer, the term of this patent is extended or adjusted under 35 U.S.C. 154(b) by 84 days.

(21) Appl. No.: 16/326,145

(22) PCT Filed: Sep. 30, 2016

(86) PCT No.: PCT/US2016/054991
§ 371 (c)(1),
(2) Date: Feb. 15, 2019

(87) PCT Pub. No.: WO2018/063391
PCT Pub. Date: Apr. 5, 2018

(65) Prior Publication Data
US 2019/0214529 A1    Jul. 11, 2019

(51) Int. Cl.
| H01L 33/32 | (2010.01) |
| H01L 33/00 | (2010.01) |
| H01L 33/06 | (2010.01) |
| H01L 33/18 | (2010.01) |
| H01L 33/24 | (2010.01) |
| H01L 27/15 | (2006.01) |
| H01L 33/20 | (2010.01) |
| H01L 33/22 | (2010.01) |
| H01L 25/16 | (2006.01) |

(52) U.S. Cl.
CPC .......... *H01L 33/32* (2013.01); *H01L 27/153* (2013.01); *H01L 27/156* (2013.01); *H01L 33/007* (2013.01); *H01L 33/06* (2013.01); *H01L 33/18* (2013.01); *H01L 33/20* (2013.01); *H01L 33/22* (2013.01); *H01L 33/24* (2013.01); *H01L 25/167* (2013.01)

(58) Field of Classification Search
None
See application file for complete search history.

(56) References Cited

U.S. PATENT DOCUMENTS

| 2004/0219703 A1 | 11/2004 | Bour et al. |
| 2006/0157714 A1 | 7/2006 | Yoo et al. |
| 2007/0248526 A1 | 10/2007 | Spencer et al. |
| 2012/0187412 A1* | 7/2012 | D'Evelyn .......... H01L 21/6835 257/76 |
| 2012/0258581 A1* | 10/2012 | Brown ................ H01L 21/0254 438/478 |

(Continued)

OTHER PUBLICATIONS

International Search Report and Written Opinion dated Jun. 19, 2017, on application No. PCT/US2016/054991.

*Primary Examiner* — Ali Naraghi
(74) *Attorney, Agent, or Firm* — Schwabe, Williamson & Wyatt, P.C.

(57) ABSTRACT

An apparatus including a red LED and monolithic multi-color LED pixel and a method of fabricating an LED device is disclosed. The method includes providing a substrate for the wafer. The method also includes forming a light emitting diode (LED) using Hydrazine to dispose above the substrate an Indium Gallium Nitride (InGaN) layer of the LED.

10 Claims, 27 Drawing Sheets

(56) References Cited

U.S. PATENT DOCUMENTS

| | | | |
|---|---|---|---|
| 2013/0015477 A1 | 1/2013 | Kim et al. | |
| 2013/0193466 A1* | 8/2013 | Sudhiranjan | H01L 33/32 257/98 |
| 2013/0292640 A1* | 11/2013 | Xiao | H01L 33/385 257/13 |
| 2014/0183448 A1* | 7/2014 | Krishnamoorthy | H01L 33/0095 257/13 |
| 2017/0098746 A1* | 4/2017 | Bergmann | H01L 33/10 |

* cited by examiner

401A

| N-GaN (1um) |
|---|
| Cladding Layer 415 |
| Buffer Stack (3um) Buffer Layer 412 |
| Si Substrate 410 |

401B

| N-GaN (1um) |
|---|
| Protective Layer 420A |
| Si₃N₄ Mask Cladding Layer 415 |
| Buffer Stack (3um) Buffer Layer 412 |
| Si Substrate 410 |

FIG.4A

HIGH PERFORMANCE LIGHT EMITTING DIODE AND MONOLITHIC MULTI-COLOR PIXEL

CROSS-REFERENCE TO RELATED APPLICATIONS

This patent application is a U.S. National Phase Application under 35 U.S.C. § 371 of International Application No. PCT/US2016/054991, filed on Sep. 30, 2016, the entire contents of which is hereby incorporated by reference herein.

BACKGROUND

A light emitting diode (LED) may be a semiconductor device, such as a p-n junction diode, that emits light when activated. A voltage may be applied to the terminals of an LED causing a release of photons. The energy of the released photons (also referred to as "electroluminescence") may correspond to the color of light emitted from the LED. LEDs are used in many applications such as indictor lamps, numeric readouts, aviation lighting, automotive headlamps, general lighting, traffic signals, and so forth. More recently, LEDs are used in LED displays that display images and videos, for example.

BRIEF DESCRIPTION OF THE DRAWINGS

The present disclosure described herein is illustrated by way of example and not by way of limitation in the accompanying figures. For simplicity and clarity of illustration, features illustrated in the figures are not necessarily drawn to scale. For example, the dimensions of some features may be exaggerated relative to other features for clarity. Further, where considered appropriate, reference labels have been repeated among the figures to indicate corresponding or analogous elements.

FIGS. 4A-4M illustrate a fabrication process for a monolithic multi-color light emitting diode pixel with nanowire light emitting diodes, according to implementations.

DETAILED DESCRIPTION

Figure 1:
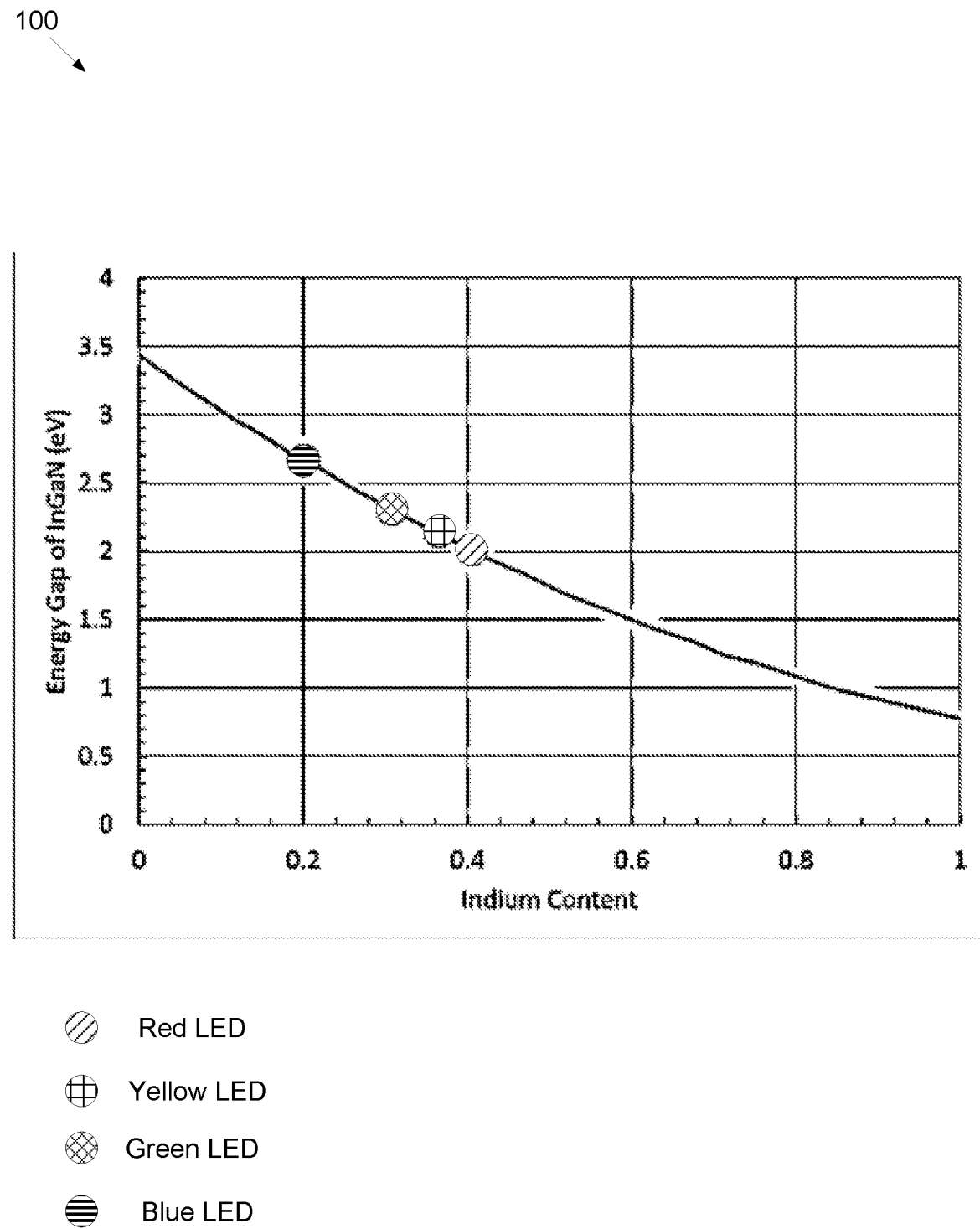
FIG. 1 illustrates a graph of the Indium content of different color light emitting diodes using Indium Gallium Nitride, according to an implementation.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Demand for devices that incorporate LED pixels continues to increase. For example, LED display panels offer a combination of display resolution and low power consumption that has helped drive demand in such applications as televisions, wearable devices, virtual reality displays, and augmented displays. An LED display, such as active matrix LED display, may include multiple pixels, where a pixel may be the smallest addressable or controllable unit of the display. A multi-color LED pixel may include multiple colors, such as red, green, and blue (RGB) LEDs. Fabrication of different color LEDs often occurs on separate wafers (e.g., non-monolithic), where a single wafer may be dedicated to a single color LED. Different color LEDs from different wafers may be transferred from the respective wafers to a backplane, such as a thin-film-transistor (TFT) backplane, where the different color LEDs are integrated to form multi-color LED pixels. The process of transferring particular color LEDs to a TFT backplane is repeated for each color LED, and ultimately affects throughput, yield, and cost. Fabricating a monolithic multi-color LED presents significant challenges, but improves yield, throughput, and cost of manufacturing. For example, monolithic multi-color LED pixels may be transferred once to a TFT backplane, rather than making three transfers (e.g., one for each color LED for a RGB pixel). Monolithic may refer to an electronic circuit, such as a multi-color LED pixel, disposed or otherwise fabricated on a common material, such as a substrate of a wafer. Challenges to fabricating monolithic multi-color LED pixels may include the temperature differences to fabricated different color LEDs, and process and material variations in fabricating different color LEDs.

Fabricating red LEDs both as part of a monolithic multi-color LED pixel and non-monolithically presents additional challenges. Red LEDs may use Indium Gallium Nitride (InGaN) material with high indium content (e.g., approximately 40% Indium content). Fabricating LEDs with high Indium content Indium Gallium Nitride (InGaN) layers is often performed at high temperatures, and lead to low Indium content and low quality red LEDs. For example, a high temperature process (e.g. greater than 700° Celsius (C)) such as, metal organic chemical vapor deposition (MOCVD) using Ammonia ($NH_3$) as a nitrogen source, may be used to form the Indium Gallium Nitride (InGaN) material of an LED. The high temperature process may negatively affect the quality of Indium Gallium Nitride (InGaN) material and the performance of red LEDs when the Indium content in InGaN is >30%.

The present disclosure addresses the above-mentioned and other deficiencies by forming an LED, such as a red LED, above a substrate of a wafer. The LED may be formed using Hydrazine to dispose above the substrate one or more Indium Gallium Nitride (InGaN) layers of the LED. Using Hydrazine as a nitrogen source to form one or more Indium Gallium Nitride (InGaN) layers of an LED may allow for lower temperature fabrication processes (e.g., less than 700°

C.), allow for the fabrication of a higher quality Indium Gallium Nitride (InGaN) material, and improve the performance of at least red LEDs. It may be noted that Hydrazine may be similarly used in the growth of other layers, such as GaN layers. In one implementation, using Hydrazine to dispose above the substrate an Indium Gallium Nitride (InGaN) layer may be used to form a monolithic multi-color LED. For instance, the process temperatures for fabricating an Indium Gallium Nitride (InGaN) layer for one or more color LEDs may be decreased to enable the fabrication of multiple color LEDs monolithically.

In another implementation, the one or more Indium Gallium Nitride (InGaN) layers of the multiple quantum well (MQW) of an LED are disposed using Hydrazine. In some implementations, the LED is a nanowire LED or micro pyramid LED. In other implementations, the core of a nanowire LED or a micro pyramid of a micro LED may include an Indium Gallium Nitride (InGaN) layer disposed using Hydrazine. Using cores or micro pyramids with indium content may improve the quality of the MQWs disposed above.

In some implementations, a red LED using Hydrazine is formed where a red multiple quantum well (MQW) of the red LED is formed using Hydrazine. In other implementations, the core of a nanowire LED is disposed using Hydrazine. In some implementations, the micro pyramid of a micro pyramid LED is disposed using Hydrazine. In some implementations, the formation of the Indium Gallium Nitride (InGaN) layer of the LED is performed at a temperature in a range of 400 degrees Celsius to 600 degrees Celsius. In implementations, Metal-Organic Vapor Deposition (MOCVD) is used to dispose the Indium Gallium Nitride (InGaN) layer of the LED. In some implementations, a red LED formed using Hydrazine has a power efficiency greater than 10 lumens per Watt (lm/W). In some implementations, the red LED formed using Hydrazine has an Indium Gallium Nitride (InGaN) layer with an average atomic concentration of equal to or greater than 40 percent Indium. In some implementation, the LED is a nanowire LED. In other implementations, the LED is a micro pyramid LED.

In some implementation, a monolithic multi-color light emitting diode (LED) pixel is formed above the substrate of the wafer. The monolithic multi-color LED pixel includes a blue LED, a green LED, and a red LED. Hydrazine is used to dispose the Indium Gallium Nitride (InGaN) layer of at least the red LED of the monolithic multi-color LED pixel. In some implementations, the monolithic multi-color LED pixel includes a yellow LED.

In one implementation, different color LEDs may be formed on the same die. In some implementations, the different color LEDs may be part of the monolithic multi-color LED pixel.

In other implementations, an integrated circuit die includes a cladding layer and a red light emitting diode (LED) that includes an Indium Gallium Nitride (InGaN) layer disposed above the cladding layer. The red LED has a power efficiency greater than 10 lumens per Watt (lm/W). In implementations, the Indium Gallium Nitride (InGaN) layer has an average atomic concentration of equal to or greater than approximately 40 percent Indium. In some implementations, the red LED is a micro pyramid LED. In other implementations, the red LED is nanowire LED.

In some implementations, an integrated circuit die includes a cladding layer and a monolithic multi-color light emitting diode (LED) pixel disposed above the cladding layer. The monolithic multi-color LED pixel includes a blue LED, a green LED, and a red LED. The red LED includes an Indium Gallium Nitride (InGaN) layer disposed above the cladding layer and has a power efficiency greater than 10 lumens per Watt (lm/W). In some implementations, the blue LED, the green LED, and the red LED are micro pyramid LEDs. In other implementations, the blue LED, the green LED, and the red LED are nanowire LEDs. In other implementations, a conductive contact is shared by the blue LED, the green LED, and the red LED. The conductive contact connects a supply voltage to the monolithic multi-color (LED) pixel. In another embodiment, the integrated circuit die includes a protective layer disposed around sides of the blue LED, the green LED, and the red LED. In implementations, the Indium Gallium Nitride (InGaN) layer of the red LED has an average concentration of equal to or greater than approximately 40 percent Indium.

FIG. 1 illustrates a graph of the Indium content of different color light emitting diodes using Indium Gallium Nitride, according to an implementation. Graph 100 shows the Indium content of LEDs for light emission of different colors. In particular, the Indium content may refer to the Indium content of the multiple quantum well (MQW) of an LED, or the Indium content of a particular layer (e.g., Indium Gallium Nitride (InGaN)) of the MQW. A multiple quantum well may refer to a layered semiconductor structure for which many quantum mechanical effects may be controlled. A layer of the MQW may confine particles (e.g., electrons or holes) in one dimension, but allow movement of the particles in other dimensions. The layers act as to confine the particles and may be controlled to allow for specific energies and band gaps that enable the emission of a particular color light with applied voltage. For example, a MQW may include one or more stacks that include a layer of Indium Gallium Nitride (InGaN) above a layer of Gallium Nitride (GaN). In some implementation, a stack of a MQW may be repeated multiple times (e.g., 4-8 times). The Indium content of the InGaN layers for a MQW may be approximately 40% for a red LED, 38-39% for a yellow LED, 35% for a green LED, and 25% for blue LED. The tolerance for the aforementioned Indium content for the different color LEDs may be ±3%.

To grow an Indium Gallium Nitride layer, a source (e.g., precursor) of Nitrogen, a source of Gallium, and a source of Indium may be provided. In implementations herein, Hydrazine may be used as a source of Nitrogen to grow some or all Indium Gallium Nitride layers, as well as other layers, such as GaN layers. In some implementation, Hydrazine may be used as a source of Nitrogen to grow some Indium Gallium Nitride layers, and another source material, such as Ammonia, may be used to grow other Indium Gallium Nitride layers. It may be noted that suitable sources of Gallium and Indium may be used. The dissociation of Ammonia ($NH_3$) gas to release a Nitrogen precursor may occur at approximately 900-1000° C. The dissociation of Hydrazine gas to release a Nitrogen precursor may occur at much lower temperatures, such as 400-500° C. In one example, the heated gasses of Indium, Gallium, and Hydrazine are flowed together to grow an Indium Gallium Nitride layer to a desired thickness. The process of growing an Indium Gallium Nitride layer using Hydrazine may be performed at the temperature range of 400-600° C.

A high quality red LED may have a MQW with one or more layers of Indium Gallium Nitride (InGaN) with an average atomic concentration that is approximately 40% Indium (e.g., with a tolerance of ±3%). In a micro pyramid LED (also referred to as "micro LED") the average concentration may be for the Indium Gallium Nitride layers above the pyramid. In a nanowire LED, the average concentration may be for the Indium Gallium Nitride (InGaN) layers around the core of the nanowire. For example, using metal organic vapor phase epitaxy (MOVPE) (or metal organic chemical vapor deposition (MOCVD)) growth, the Indium composition may be changed by varying the growth temperature and TMI/(TMI+TEG) molar ratio (Trimethylindium (TMI), Triethylgallium (TEG)). At temperatures below 700° C., higher TMI/(TMI+TEG) may result in higher Indium content. For a given TMI/(TMI+TEG) ratio, temperatures higher than 700° C. may result in smaller Indium content. The external quantum efficiency (EQE) of the InGaN-based LEDs may abruptly drop toward the red spectral region. The efficiency drop in the long-wavelength region may be considered the quantum-confined Stark effect (QCSE), which may cause a reduction in the radiative recombination ratio with the redshift of the emission wavelength. The InGaN quantum wells (QW) grown on a GaN underlayer may have a compressive strain owing to the lattice mismatch that induces a piezoelectric field along the (0001) direction. The QCSE may be a consideration for the EQE of the LED grown on a (0001) surface, especially in the long-wavelength region. The growth of an LED using a semi- or nonpolar surface may reduce the QCSE. A higher Indium content of the QW may be used in comparison with that grown on the (0001) surface because of the blue shift accompanied by the reduction of the QCSE. These phenomena make the crystal growth challenging for obtaining a QW without the crystal degradation in the red spectral region because the degradation of the InGaN QW occurs with increasing Indium content. The phase separation of the InGaN material may be induced when a high Indium composition is used to obtain red emission.

A high quality red LED produced using Hydrazine (both monolithically and non-monolithically) may have power efficiency greater than 10 lumens per Watt (lm/W). In one implementation, the power efficiency of a red LED produced using Hydrazine may be approximately 30 lm/W. Power efficiency (also referred to as "luminous efficacy" herein) is a measure of how well a light source (e.g., LED) produces visible light and is the ratio of luminous flux to power.

For light emitting devices, such as light emitting diodes (LED), the emission wavelength may be determined by the band gap of the active region of the LED together with thickness determined confinement effects. Often the active region includes one or more quantum wells (QW). For III-nitride based LED devices, such as GaN based devices, the active region (e.g., quantum well) material is preferably ternary, such as $InxGa1-xN$, where $0 \leq x \leq 1$. The band gap of such III-nitride is dependent on the amount of Indium incorporated in the active region (e.g., in the QW(s)). Higher Indium incorporation will yield a smaller band gap and thus longer wavelength of the emitted light. As used above, the term "wavelength" may refer to the peak emission wavelength of the LED. It may be noted that a typical emission spectra of a semiconductor LED is a narrow band of wavelength centered around the peak wavelength.

FIGS. 2A-2H illustrate a fabrication process for a monolithic multi-color light emitting diode pixel with micro pyramid light emitting diodes, according to an implementation. Fabrication process 200 includes wafer 201 at various stages of the fabrication process 200, according to one exemplary implementation. It may be noted that fabrication process 200 is shown for purposes of illustration, rather than limitation. Fabrication process 200 may be performed in any order, include any number of processes, and include more, the same, or fewer processes. It may also be noted that for purposes of illustration, rather than limitation, materials are illustrated in the various layers of fabrication process 200. Other materials, other or in addition to the materials illustrated in FIGS. 2A-2H, may also be used in other implementations. FIGS. 2A-2H shows the formation of a monolithic multi-color light emitting diode (LED) pixel above the substrate 210 of the wafer 201. It may be noted that multiple multi-color light emitting diode (LED) pixels may be formed on wafer 201. It may be noted that the formation of a monolithic multi-color light emitting diode (LED) pixel is described for purposes of illustration, rather than limitation. It may also be noted may be noted that processes herein, such as fabrication process 200, process flow 300 of FIG. 3, fabrication process 400, and process flow 500, may be extended to produce a single color LED, such as a red LED. For example, processes for creating other color LEDs may be removed from fabrication process 200 to form a wafer of single color LEDs, in some implementations.

Wafer 201A illustrates a substrate 210. In one exemplary implementation, substrate 210 may be Sapphire. Substrate 210 may be a variety of materials, including, but not limited to, Silicon, Gallium Nitride (GaN), Germanium, or Silicon Carbide. Substrate 210 may be silicon on insulator (SOI). In one implementation, substrate 210 is silicon. Crystallographic orientation of a substantially monocrystalline substrate 210 may be any of (100), (111), or (110). Other crystallographic orientations are also possible. The crystallographic orientations of substrate 210 may be offcut. In one implementation, substrate 210 is (100) silicon with crystalline substrate surface region having cubic crystallinity. In another implementation, for a (100) silicon substrate 210, the semiconductor surface may be miscut, or offcut, for example 2-10° toward [110]. In another implementation, substrate 210 is (111) silicon with crystalline substrate surface region having hexagonal crystallinity.

It may be noted that a buffer layer (not shown) may be disposed between cladding layer 215 (e.g., seed layer of N—GaN) and substrate 210. An appropriate buffer layer may be disposed corresponding to the material type of substrate 210.

A cladding layer 215 may be disposed or grown over substrate 210. The cladding layer 215 may serve as a seed layer to grow micro pyramids as further described with at least respect to the following Figures. It may be noted that cladding layer 215 may influence the material type of the micro pyramids disposed above cladding layer 215. In one implementation, cladding layer 215 may be GaN, such as N-type GaN (N—GaN). Cladding layer 215 may be a variety of materials including one or more of Aluminum Nitride (AlN), GaN (e.g., P-type GaN or N-type GaN), or Aluminum Gallium Nitride (AlGaN) (e.g., with different Al compositions). The cladding layer 215 may be approximately 1 to 4 micrometers (μm) thick.

A protective layer 220A (e.g., first protective layer) may be disposed or deposited above cladding layer 215. The protective layer, such as protective layer 220A, may also be referred to as a "hard mask" or "hard mask layer" herein. In one exemplary implementation, protective layer 220A may be Silicon Nitride ($Si_3N_4$). Protective layer, such as protective layer 220A may be a variety of materials including one or more of Silicon Oxide ($SiO_2$) or Silicon Nitride ($Si_3N_4$). Protective layer 220A may be 200-1000 nm thick, for example. In one implementation, multiple trenches 216 are formed in protective layer 220A. The trenches may remove an area of the protective layer 220A to expose the cladding layer 215 in the area of trenches 216. In one implementation, micrometer lithography may be used to open trenches 216 in protective layer 220A. In some implementations, the width of the trenches 216 may be 1 μm to 25 μm in width. Micro pyramid LEDs may be grown in trenches 216. In other implementations, the width of the trenches may be 100 nanometers (nm) to 25 μm. The width of the trenches 216 may be referred to as the minimum feature size of a micro pyramid LED, and enable the use of micrometer (or nanometer) lithography equipment to reduce the cost of the fabrication equipment. It may be noted that element numbers herein, such as trench 216, may refer to all the elements having the same base number, such as trench 216A, 216B, and 216C, while a base element number with a corresponding letter, such as trench 216A, may refer to only the specific element number (e.g., trench 216A), unless otherwise specified.

Wafer 201B illustrates the formation of rod 217 in trenches 216. Rods 217 are disposed above cladding layer 215. Rod 217A may be grown in trench 216A. Rod 217B may be grown in trench 216B. Rod 217C may be grown in trench 216C. In some implementations, rods 217 may also be referred to as "micro-rods" and be considered as part of (e.g., a base portion) of a micro pyramid. Rod 217 may have material characteristics of cladding layer 215. For example, cladding layer 215 may be a seed layer and an N—GaN rod 217 may be grown on an N—GaN cladding layer 215, and so forth. In one implementation, rod 217 may be InGaN with Indium content of approximately 10% with a tolerance of ±3%. In some implementations, rod 217 may have an Indium content in the range of approximately 10% to 20% with a tolerance of ±3%. In some implementations, rods 217 with Indium content may be grown using Hydrazine. Growing rods 217 with Indium content may help facilitate the growth (e.g., reduced lattice mismatch) of layers disposed above, such as the MQW.

Figure 2A:
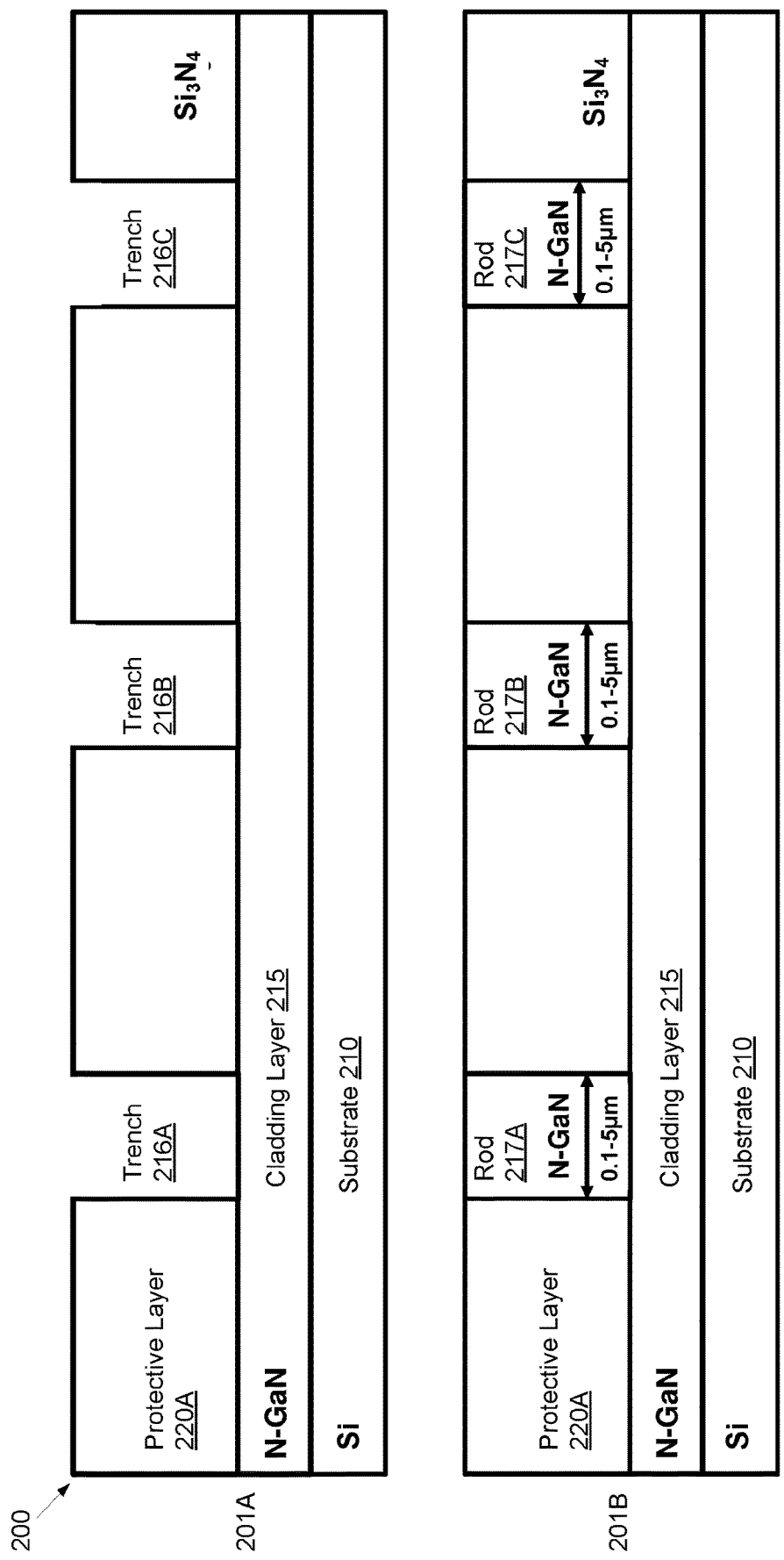
FIGS. 2A-2H illustrate a fabrication process for a monolithic multi-color light emitting diode pixel with micro pyramid light emitting diodes, according to an implementation.
Figure 2B:
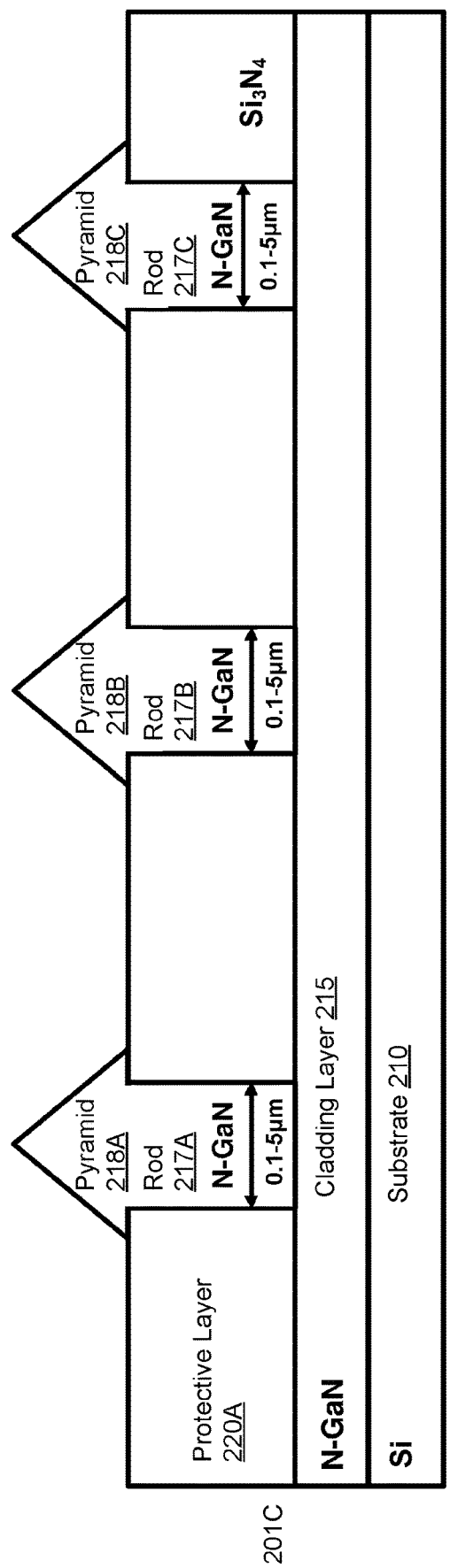

In FIG. 2B, wafer 201C illustrates the formation of pyramid 218 (also referred to as "micro pyramid" herein) disposed above rods 217. Pyramids 218 may be grown a respective one of rods 217. It may be noted that the rods 217 may be allowed to continue to grow to form pyramids 218. It may also be noted that the growth of rod 217 and pyramid 218 may be a single process in some implementations. Micro pyramid may refer to pyramid 218 or both rod 217 and pyramid 218. Pyramid 218 may have material characteristics of rod 217. For example, an N—GaN pyramid may be grown on an N—GaN rod. In one implementation, pyramid 218 may be InGaN with Indium content of approximately 10% with a tolerance of ±3%. Similar to rods 217, pyramids 218 with Indium content may be grown using Hydrazine.

Figure 2C:
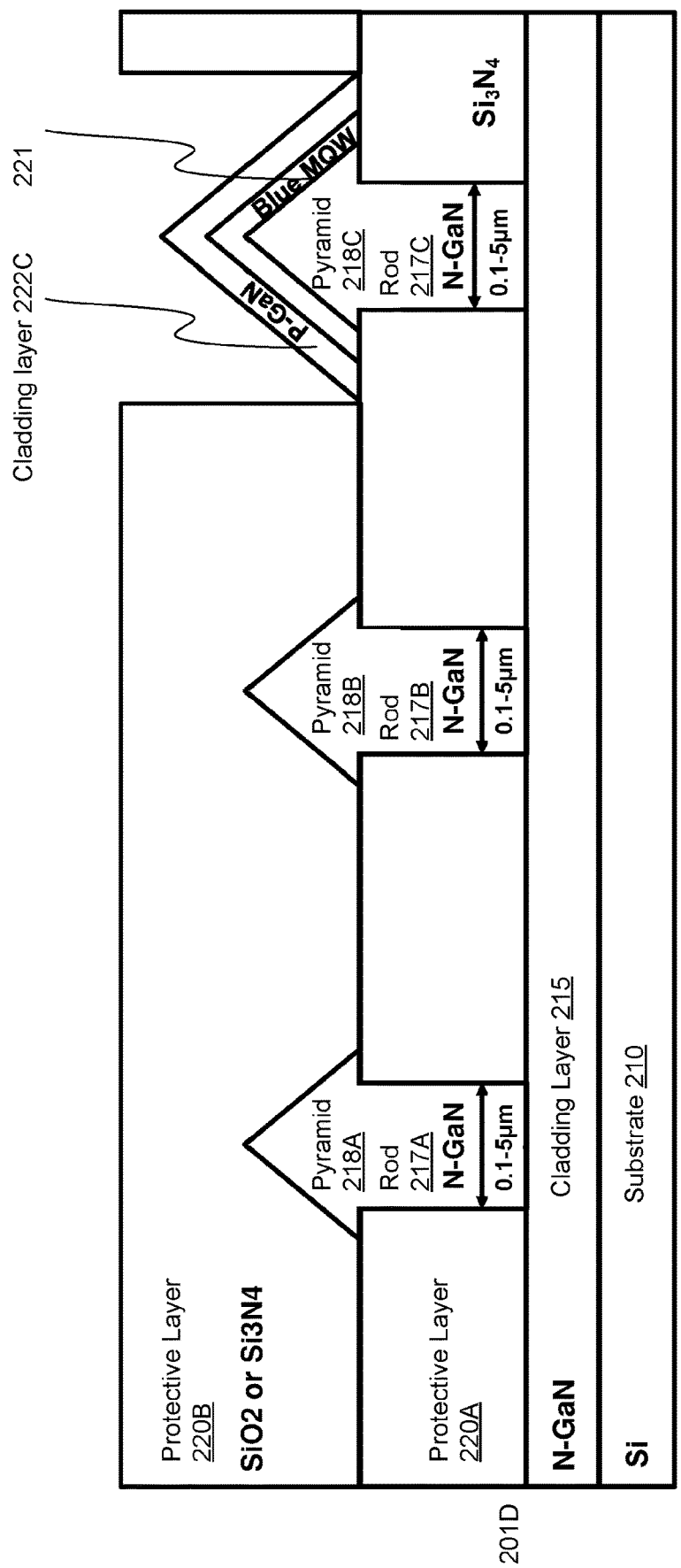

In FIG. 2C, wafer 201D illustrates a formation of a blue multiple quantum well (MQW) 221 disposed above pyramid 218C, and cladding layer 222C disposed above blue MQW 221. In one implementation, protective layer 220B (e.g., second protective layer) may be disposed or deposited above protective layer 220A and above pyramids 218. Protective layer 220B may be a similar or different material than protective layer 220A, and have similar features as described with respect to protective layer 220A. Protective layer 220B may be planarized after deposition. Protective layer 220B may be removed above pyramid 218C by etching a trench. Protective layer 220B above pyramids 218A and 218B may not be etched and protect the respective pyramids from the subsequent processes.

Blue MQW 221 is disposed or grown above pyramid 218C. As described above, a MQW, such as blue MQW 221, may include multiple layers and a specific Indium content to produce a corresponding color electroluminescence. In some implementations, Hydrazine may be used to grow one or more Indium Gallium Nitride layers of the blue MQW 221.

In other implementations, Ammonia may be used to form one or more Indium Gallium Nitride layers of a MQW or other layers, such as micro pyramids (e.g., rod 217 and pyramid 218) or cores (e.g. core 417) described herein. As noted above, a comparable fabrication process implementing Ammonia, instead of Hydrazine, may be performed at higher process temperatures. It may be further noted that fabrication processes using Ammonia may be performed prior to fabrication processes using Hydrazine, in some implementations. For example, the blue MQW 221 (formed using Ammonia) may be deposited prior to the red MQW (formed using Hydrazine) so that the high temperature used to form the blue MQW 221 does not affect the red MQW formed at lower temperatures. Other color MQWs formed at lower temperatures than the blue MQW 221 may have minimal effect on the previously formed blue MQW 221. It may be noted that for at least some processes implementing Hydrazine, Ammonia may alternatively be used in view of the above considerations and trade-offs. The above considerations may also be applied to other processes herein, such as fabrication process 200, process flow 300, fabrication process 400, and process flow 500.

In some implementations, the use of Hydrazine may allow for red micro LED to be integrated monolithically with blue and green micro LEDs (e.g., micro LED pixel) that may also be made using Hydrazine to lower the overall growth temperature.

Cladding layer 222C is disposed above blue MQW 221. In one implementation, cladding layer 222C is P-type GaN (P—GaN). It may be noted that pyramid 218 (and rod 217) may be the N-type junction of a LED, and cladding layer 222 may be the P-type junction of the LED. It also may be noted, that the dopant type for pyramid 218 and cladding layer 222 may be reversed, in some implementations. Cladding layer 222 may be a variety of materials similar as described with respect to pyramid 218 and with opposite dopant type. Cladding layer 222C may be formed using Hydrazine or Ammonia, similar as described with respect to the blue MQW 221.

Figure 2D:
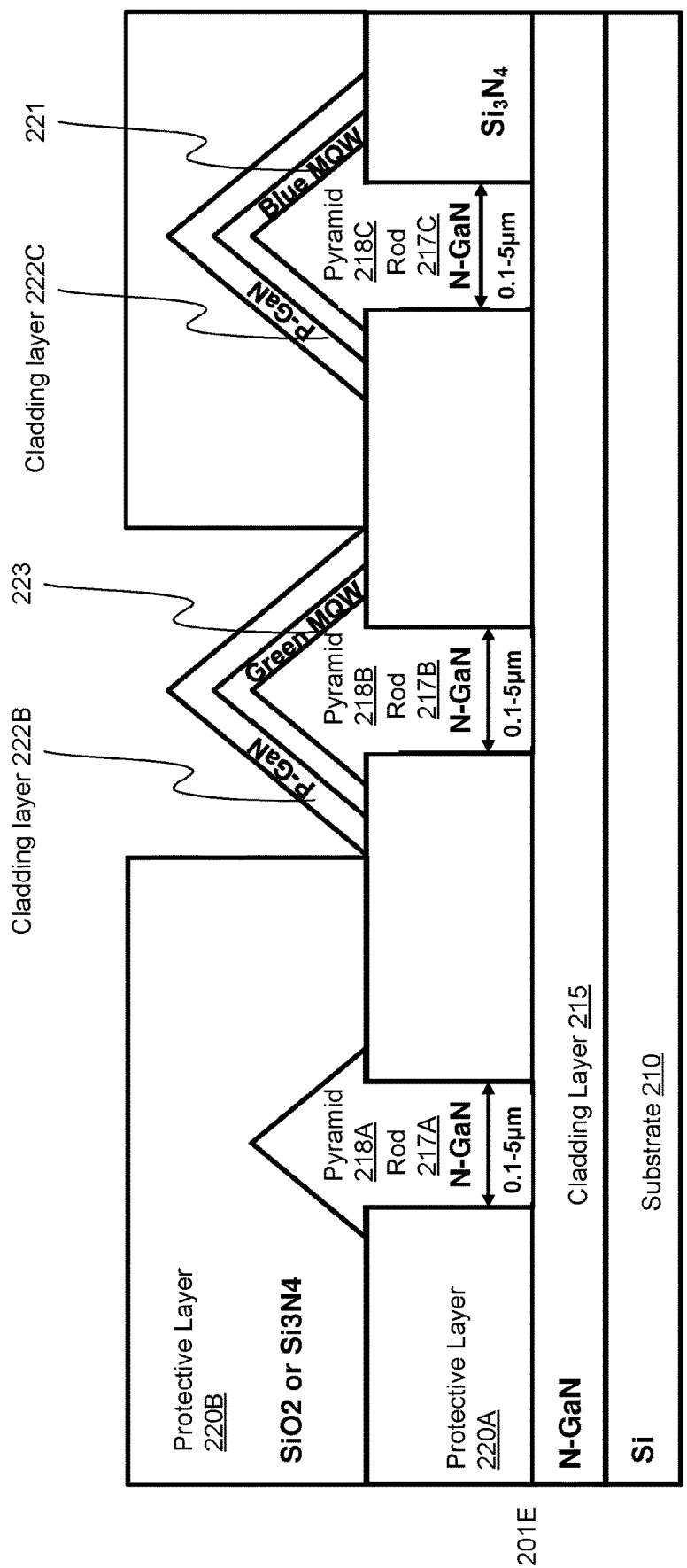

In FIG. 2D, wafer 201E illustrates a formation of a green multiple quantum well (MQW) 223 disposed above pyramid 218B, and cladding layer 222B disposed above green MQW 223. In one implementation, another protective layer (e.g., third protective layer) may be disposed or deposited above protective layer 220B and above pyramid 218C, and planarized. For the sake of convenience the third protective layer may also be referred to as protective layer 220B, but it may be noted that some portion of protective layer 220B (e.g., above cladding layer 222A) may be formed from a subsequent process as described with respect to FIG. 2C. Protective layer 220B may be removed above pyramid 218B by etching a trench. Protective layer 220B above pyramids 218A and 218C may not be etched and protect the respective pyramids from the subsequent processes. Green MQW 223 is disposed or grown above pyramid 218B. As described above, a MQW, such as green MQW 223, may include multiple layers and a specific Indium content to produce a corresponding color electroluminescence. In some implementations, Hydrazine may be used to grow one or more Indium Gallium Nitride layers of the green MQW 223. In other implementations, Ammonia may be used to form one or more Indium Gallium Nitride layers of green MQW 223, as described above. Cladding layer 222B is disposed above the green MQW 223. Cladding layer 222B may include similar features as cladding layer 222A. Cladding layer 222B may be formed using Hydrazine or Ammonia, similar as described with respect to cladding layer 222C.

Figure 2E:
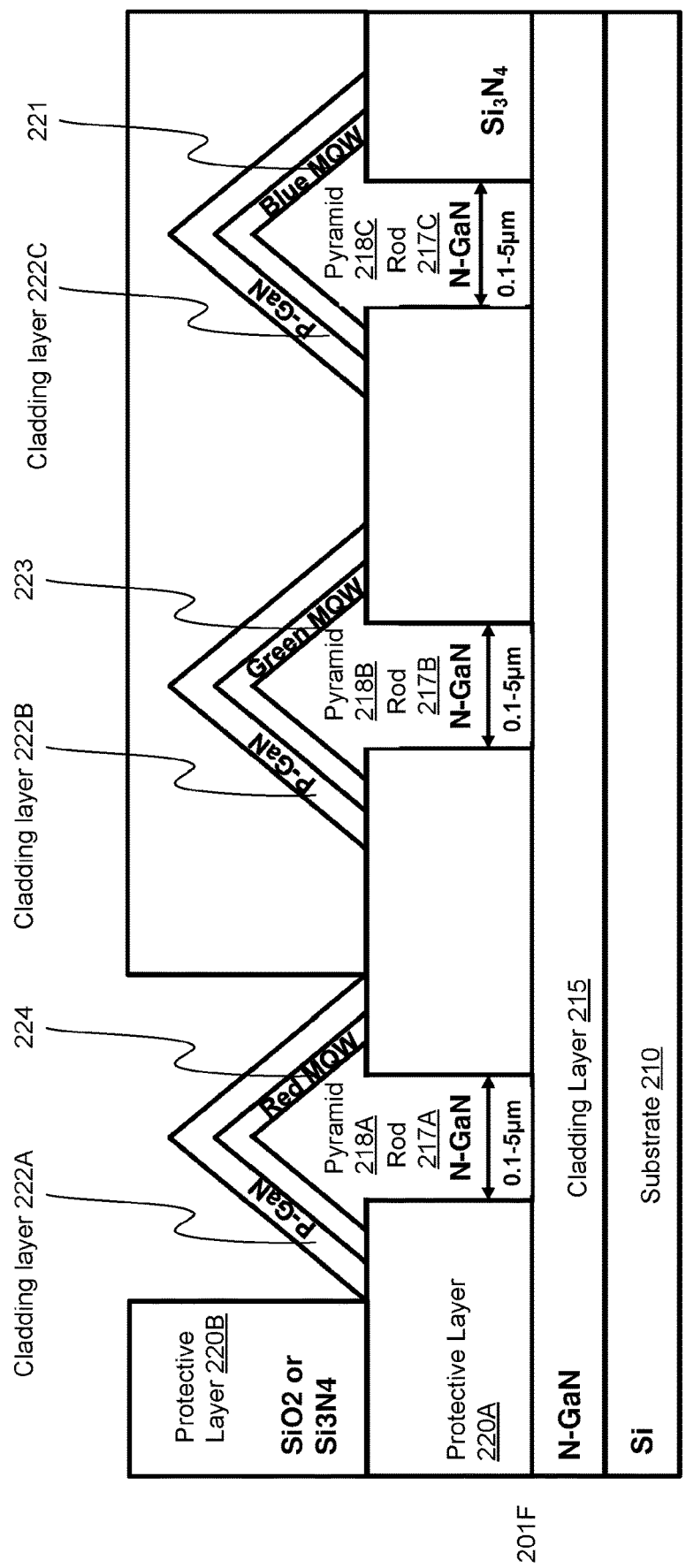

In FIG. 2E, wafer 201F illustrates a formation of a red multiple quantum well (MQW) 224 disposed above pyramid 218A, and cladding layer 222A disposed above red MQW 224. In one implementation, another protective layer (e.g., fourth protective layer) may be disposed or deposited above protective layer 220B and above pyramid 218B, and planarized. For the sake of convenience the fourth protective layer may also be referred to as protective layer 220B, but it may be noted that some portion of protective layer 220B (e.g., above cladding layer 222B) may be formed from a subsequent process as described with respect to FIG. 2D. Protective layer 220B may be removed above pyramid 218A by etching a trench. Protective layer 220B above pyramids 218B and 218C may not be etched and protect the respective pyramids from the subsequent processes. Red MQW 224 is disposed or grown above pyramid 218A. In some implementations, Hydrazine may be used to grow one or more Indium Gallium Nitride layers of the red MQW 224. As described above, a MQW, such as red MQW 224, may include multiple layers with a specific Indium content to produce a corresponding color electroluminescence. Cladding layer 222A is disposed above the red MQW 224. Cladding layer 222A may include similar features as cladding layer 222C. Cladding layer 222A may be formed using Hydrazine.

It may be noted that a yellow micro pyramid LED (not shown) may be formed in a similar manner as described with respect to the FIGS. 2A-2H. For example, a trench may be formed in protective layer 220A. A rod and pyramid may be grown in the trench using Hydrazine. A yellow MQW may be disposed on the pyramid followed by a cladding layer, both using Hydrazine.

Figure 2F:
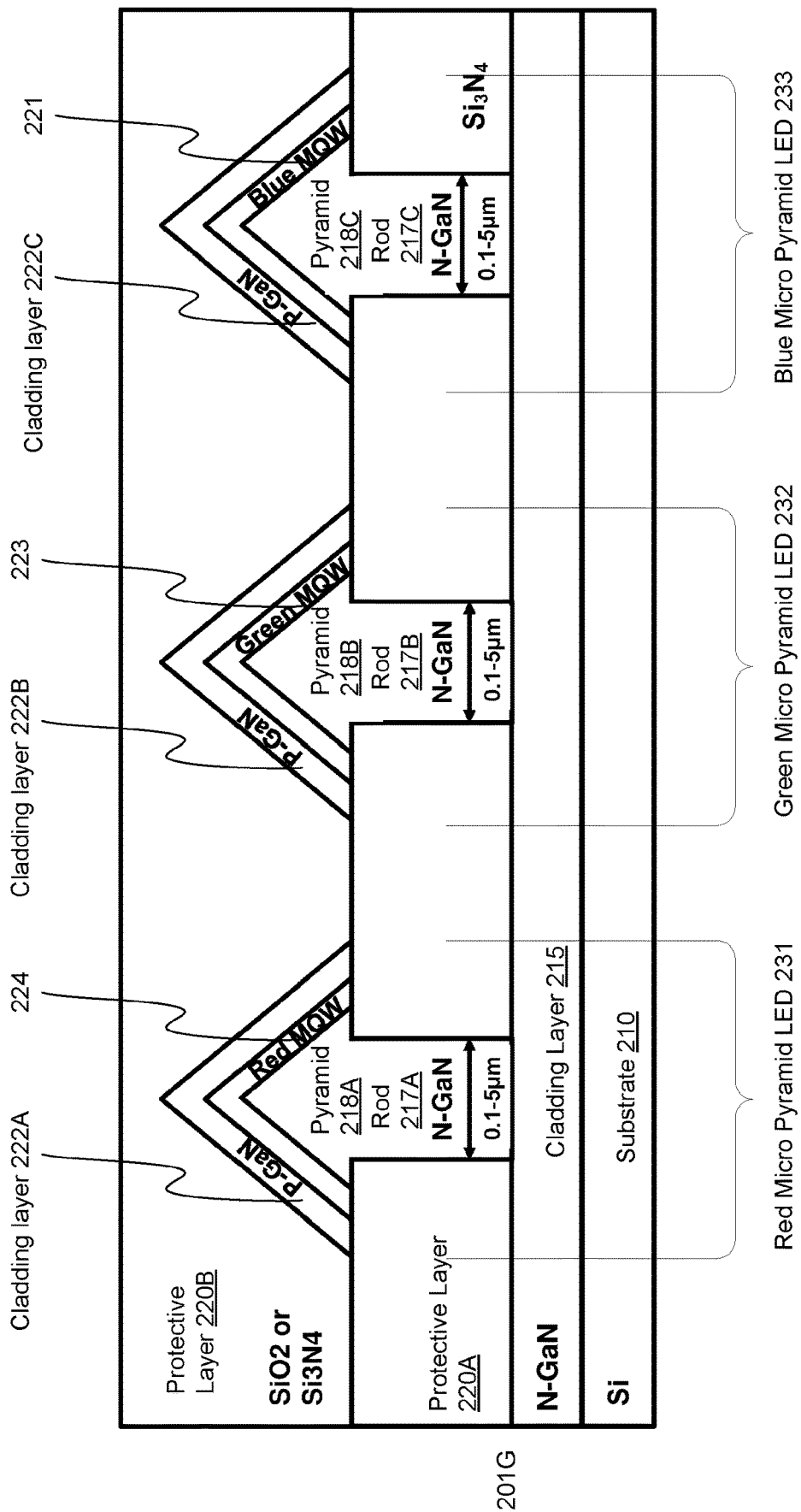

In FIG. 2F, wafer 201G illustrates a protective layer disposed above the red micro pyramid LED 231, the green micro pyramid LED 232, and the blue micro pyramid LED 233. In one implementation, another protective layer (e.g., fifth protective layer) may be disposed or deposited above protective layer 220B and red micro pyramid LED 231, and planarized. For the sake of convenience the fifth protective layer may also be referred to as protective layer 220B, but it may be noted that some portion of protective layer 220B (e.g., above red micro pyramid LED 231) may be formed from a subsequent process as described with respect to FIG. 2E.

Figure 2G:
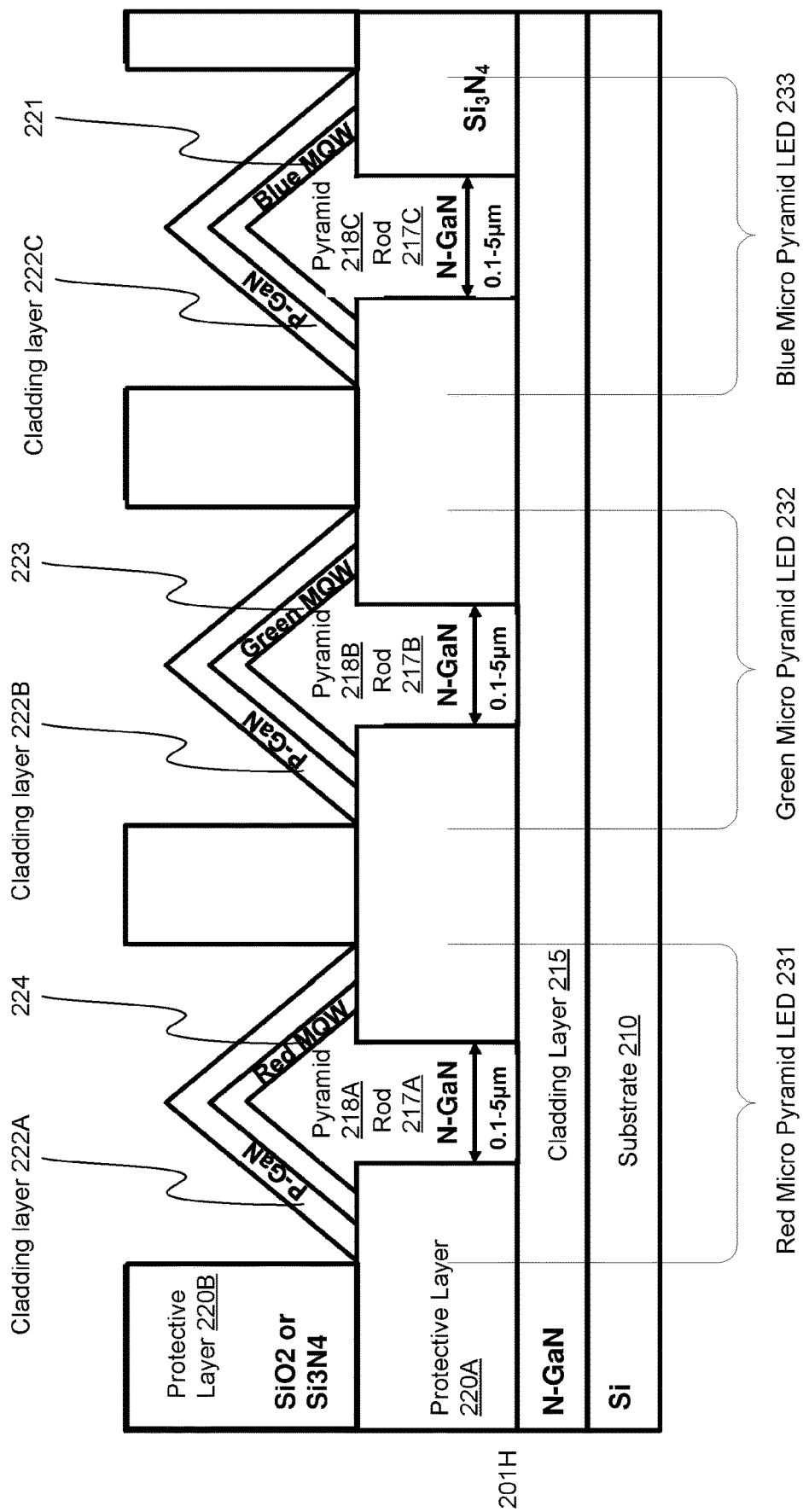

In FIG. 2G, wafer 201H illustrates trenches (also referred to as "holes" herein) formed above the cladding layer 222 of the red micro pyramid LED 231, the green micro pyramid LED 232, and the blue micro pyramid LED 233. In one implementation, protective layer 220B above the red micro pyramid LED 231, the green micro pyramid LED 232, and the blue micro pyramid LED 233 may be removed or etched to expose the cladding layers 222 of the respective micro pyramid LEDs.

Figure 2H:
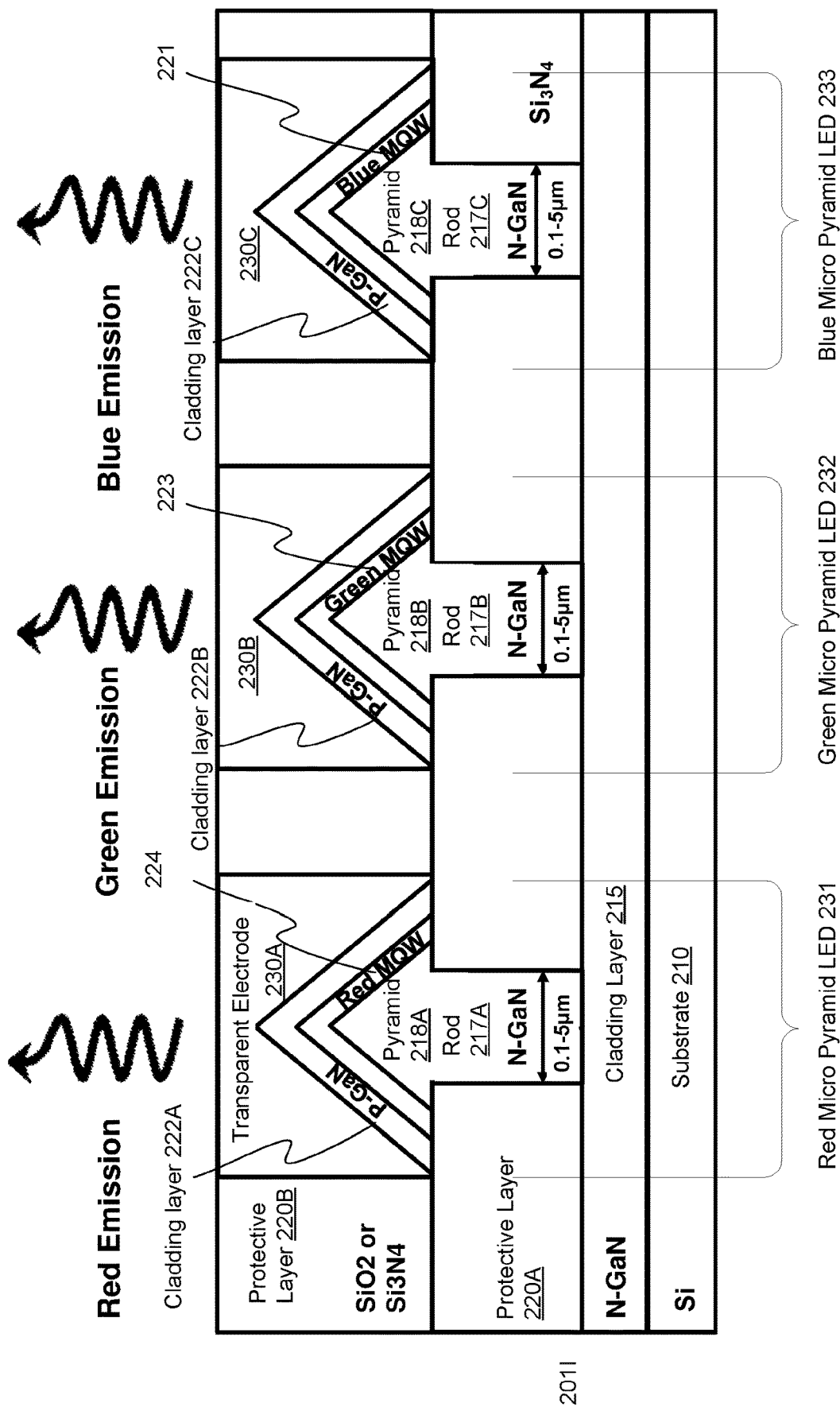

In FIG. 2H, wafer 201I illustrates transparent electrodes 230 formed above the cladding layer 222 of red micro pyramid LED 231, the green micro pyramid LED 232, and the blue micro pyramid LED 233. Transparent electrode 230 is disposed or deposited over the red micro pyramid LED 231, the green micro pyramid LED 232, and the blue micro pyramid LED 233 to allow the emission of light to radiate in a direction opposite substrate 210. In one implementation, transparent electrode 230 may be Indium-Tin-Oxide (ITO). Transparent electrode 230 may be a variety of materials including one or more of ITO or Zinc Oxide or other appropriate conductive transparent material.

In some implementations, a reflective electrode (not shown) may be used in the place of transparent electrode 230. With a reflective electrode, the micro pyramid LEDs would radiate light towards the direction of substrate 210.

In some implementations, a conductive contact, such as a metal contact, may be formed to connect to cladding layer 215. For example, a metal contact may be formed through protective layer 220A and 220B to cladding layer 215. The conductive contact would be shared between the blue micro pyramid LED 233, the green micro pyramid LED 232, and the red micro pyramid LED 231 of the monolithic multi-color light emitting diode (LED) pixel and connect to a supply voltage (not shown) to activate the micro pyramids LEDs. It may be noted that in a non-monolithic LED pixel the LEDs may not share a conductive contact. In some implementations, the cladding layer 215 may be the common contact shared by the between the blue micro pyramid LED 233, the green micro pyramid LED 232, and the red micro pyramid LED 231 of the monolithic multi-color light emitting diode (LED) pixel.

In some implementations, the conductive contact may connect to cladding layer 215 through the backside (e.g., from the direction of substrate 210). For example, the bottom of wafer 201 may be removed to expose the cladding layer 215. The cladding layer 215 may be placed on pads on the TFT backplane. In some implementations, an etch may be applied to separate the cladding layer 215 associated with different color LEDs of a monolithic multi-color light emitting diode (LED) pixel, so that the color LED may be individually controlled.

It may be noted that a monolithic multi-color LED pixel may include two or more different color micro pyramid LEDs. For example, wafer 201I shows a monolithic multi-color LED pixel including a blue micro pyramid LED, a green micro pyramid LED, and a red micro pyramid LED.

It may be noted that red micro pyramid LED 231, green micro pyramid LED 232, and blue micro pyramid LED 233 of the monolithic multi-color LED pixel are surrounded (e.g., contiguous and without a boundary) by a protective layer 220A and 220B. It may be noted that a non-monolithic multi-color LED pixel may have different color LEDs that are diced separately and later integrated on a backplane to form a pixel. The associated protective layer of a non-monolithic multi-color LED pixel may not be contiguous and may have a boundary between two LEDs of a pixel.

Figure 3:
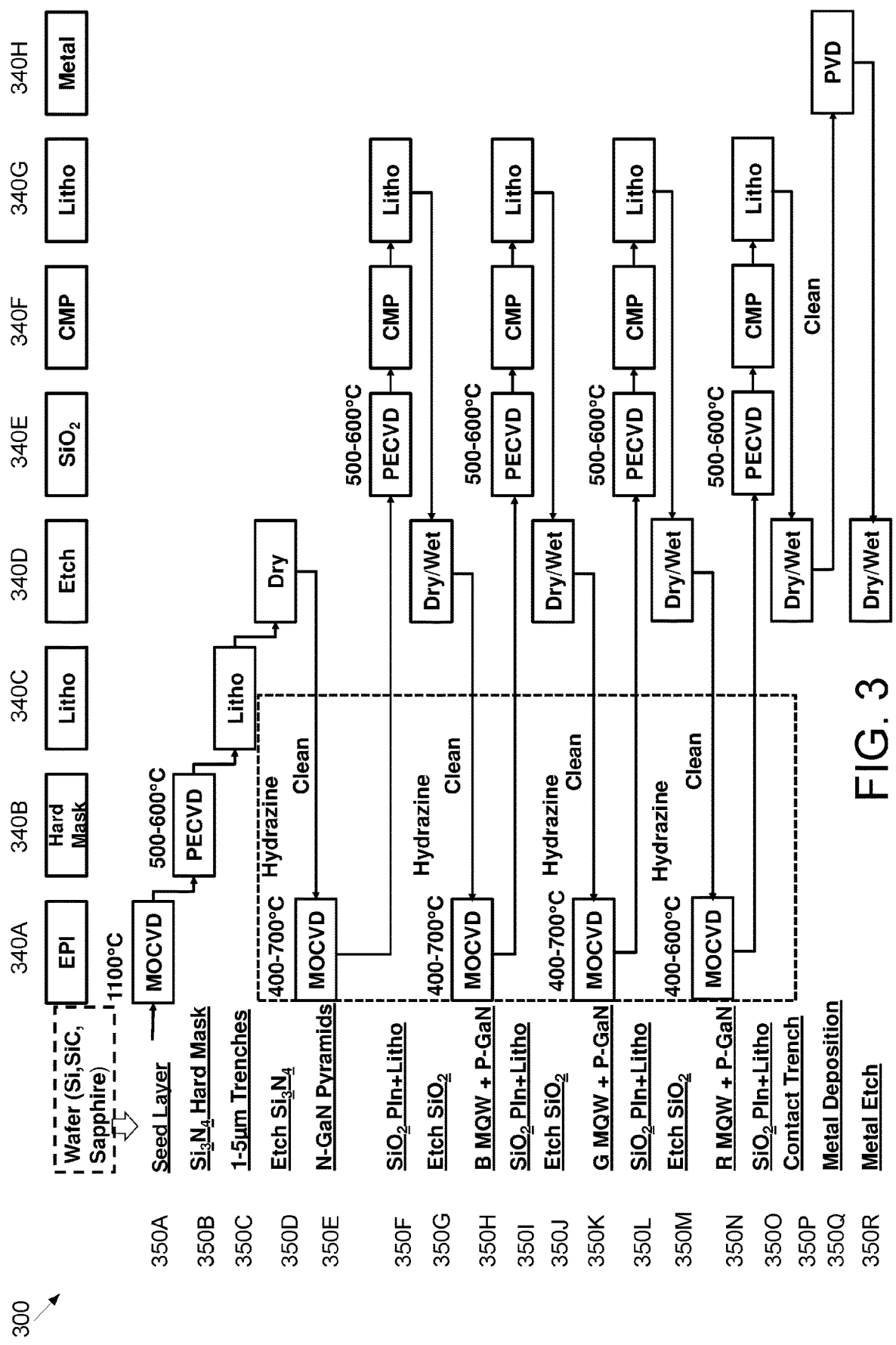
FIG. 3 illustrates a process flow for fabricating a monolithic multi-color light emitting diode pixels with micro pyramid light emitting diodes on a wafer, according to another implementation.

FIG. 3 illustrates a process flow for fabricating monolithic multi-color LED pixels with micro pyramid light emitting diodes on a wafer, according to another implementation. The horizontal row of process flow 300 shows different fabrication processes 340, and the vertical row shows different wafer processes 350. Fabrication process 340A may include epitaxy (EPI). Epitaxy may be the deposition of one or more epitaxial films or layers. For example, an epitaxial process may include metal organic chemical vapor deposition (MOCVD) performed at a variety of temperatures. Fabrication process 340B may include a hard mask process where a material is used as an etch mask. For example, a hard mask process may include plasma-enhanced chemical vapor deposition (PECVD). Fabrication process 340C may include a photolithography process that uses light to transfer a pattern to the wafer. Fabrication process 340D may include an etching process to remove one or more layers (or parts of one or more layers) from the surface of a wafer. The etching process may include dry etch or wet etch. Fabrication process 340E may include a protective layer process, and may include the deposition of materials such as Silicon Dioxide ($SiO_2$). Fabrication process 340F may include a planarization process to smooth the surface of the wafer. The planarization process may include chemical-mechanical planarization (CMP). Fabrication process 340G may include a photolithography process and may be similar to fabrication process 340C. Fabrication process 340H may include a metallization process to form connections to the circuits, such as multi-color LED pixels. The metallization process may include physical vapor deposition (PVD). It may be noted that fabrication processes 340 have been described for purposes of illustration rather than limitation. It may be further noted that the same, fewer or additional fabrication processes may be used. It also may be noted that the same or different processes as described may be used to perform the various fabrication processes 340.

A wafer may start at wafer process 350A undergo the various wafer processes 350A through 350R. Wafer processes 350 align with different fabrication processes 340. For example, wafer process 350A includes a seeding process to form a seed layer (e.g., cladding layer), such as N—GaN. Fabrication process 340A, such as MOCVD, may be used to form the seed layer. Wafer process 350B may include the formation of a hard mask layer. Wafer process 350C and 350D may include the formation of trenches for the micro pyramids. Wafer process 350A-350D may be further described with respect to wafer 201A of FIG. 2A. Wafer process 350E may include the formation of the micro pyramids (rods and pyramid) using Hydrazine in and above the trenches. Wafer process 350E may be further described with respect to wafer 201B and 201C of FIGS. 2A and 2B, respectively. Wafer process 350F may include the formation, planarization, and lithography of a protective layer (e.g., second protective layer). Wafer process 350G may include the etching of the protective layer. Wafer process 350H may include the formation of the blue MQW using Hydrazine and cladding layer of the blue micro pyramid LED using Hydrazine. Wafer processes 350F-350H may be further described with respect to wafer 201D of FIG. 2C. Wafer process 350I may include the formation, planarization, and lithography of a protective layer (e.g., third protective layer). Wafer process 350J may include the etching of the protective layer. Wafer process 350K may include the formation of the green MQW using Hydrazine and cladding layer of the green micro pyramid LED using Hydrazine. Wafer processes 350I-350K may be further described with respect to wafer 201E of FIG. 2D. Wafer process 350L may include the formation, planarization, and lithography of a protective layer (e.g., fourth protective layer). Wafer process 350M may include the etching of the protective layer. Wafer process 350N may include the formation of the red MQW using Hydrazine and cladding layer of the red micro pyramid LED using Hydrazine. Wafer processes 350L-350N may be further described with respect to wafer 201F of FIG. 2E. Wafer process 350O may include the formation, planarization, and lithography of a protective layer (e.g., fifth protective layer). Wafer processes 350O may be further described with respect to wafer 201G of FIG. 2F.

Wafer process 350P may include forming a trench for a conductive contact to, for example, the uppermost layer to the cladding layer. Wafer process 350Q may include depositing the conductive contact material in the trench. Wafer process 350R may include an etch process to etch conductive contact. The above processes 350P-350 may be may be implemented to fabricate the reflective or transparent electrode.

It may be noted that wafer processes 350 have been described for purposes of illustration rather than limitation. It may be further noted that the same, fewer or additional wafer processes may be used. It also may be noted that the same or different materials as described or illustrated may be used to in the various wafer processes 350.

FIGS. 4A-4M illustrate a fabrication process for a monolithic multi-color light emitting diode pixel with nanowire light emitting diodes, according to implementations. Fabrication process 400 includes wafer 401 at various stages of the fabrication process 400, according to one exemplary implementation. It may be noted that fabrication process 400 is shown for purposes of illustration, rather than limitation. Fabrication process 400 may be performed in any order, include any number of processes, and include more, the same, or fewer processes. It may also be noted that for purposes of illustration, rather than limitation, materials are illustrated in the various layers of fabrication process 400. Other materials, other or in addition to the materials illustrated in FIGS. 4A-4M, may also be used in other implementations. FIGS. 4A-4M shows the formation of a monolithic multi-color light emitting diode (LED) pixel with nanowire LEDs above the substrate 410 of the wafer 401.

Wafer 401A illustrates a substrate 410. In one exemplary implementation, substrate 410 may be Silicon. Substrate 410 may be a variety of materials, including, but not limited to Sapphire, Gallium Nitride (GaN), Germanium, or Silicon Carbide such as 3C-Silicon Carbide (3C—SiC). Substrate 410 may be silicon on insulator (SOI). It may be noted that substrate 410 may be similar as described with respect to substrate 210 of FIGS. 2A-2H.

Buffer layer 412 (also referred to as "buffer stack") may include one or more layers and may be disposed between cladding layer 415 (e.g., seed layer of N—GaN) and substrate 410. An appropriate buffer layer 412 may be disposed corresponding to the material type of substrate 410.

A cladding layer 415 may be disposed or grown over substrate 410. The cladding layer 415 may serve as a seed layer to grow nanowire cores (also referred to as "cores" or "nanowires" herein). It may be noted that cladding layer 415 may influence the material type of the nanowire cores disposed above cladding layer 415. In one implementation, cladding layer 415 may be GaN, such as N-type GaN (N—GaN). Cladding layer 415 may be a variety of materials including one or more of Aluminum Nitride (AlN), GaN (e.g., P-type GaN or N-type GaN), or Aluminum Gallium Nitride (AlGaN) (e.g., with different Al compositions). The cladding layer 415 may be approximately 1 to 4 micrometers (μm) thick.

Wafer 401B illustrates a protective layer 420A (e.g., first protective layer) that may be disposed or deposited above cladding layer 415. The protective layer, such as protective layer 420A, may also be referred to as a "hard mask" or "hard mask layer" herein. In one exemplary implementation, protective layer 420A may be Silicon Nitride ($Si_3N_4$). Protective layer, such as protective layer 420A, may be a variety of materials including one or more of Silicon Oxide ($SiO_2$) or Silicon Nitride ($Si_3N_4$). Protective layer 420A may be 200-1000 nm thick, for example.

Figure 4B:
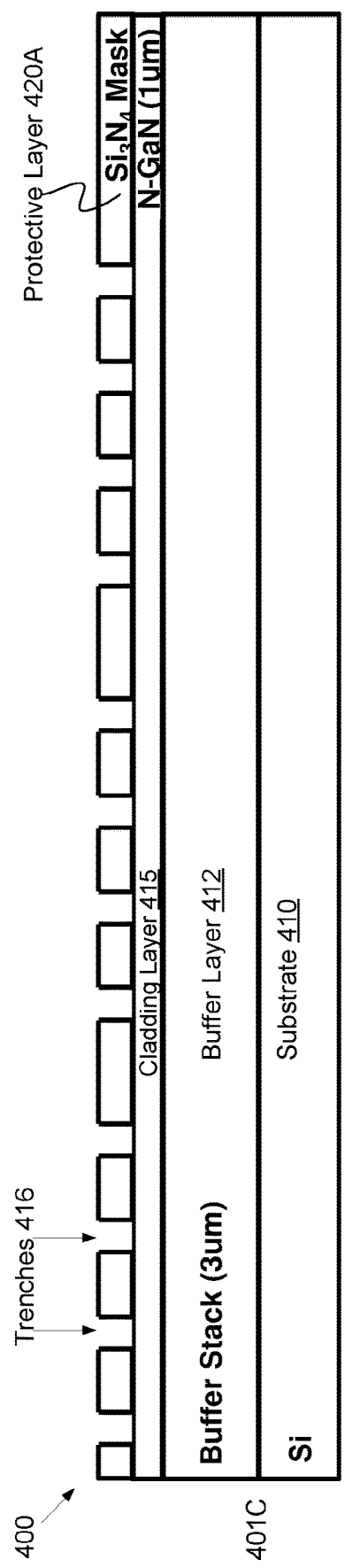
Figure 4B:
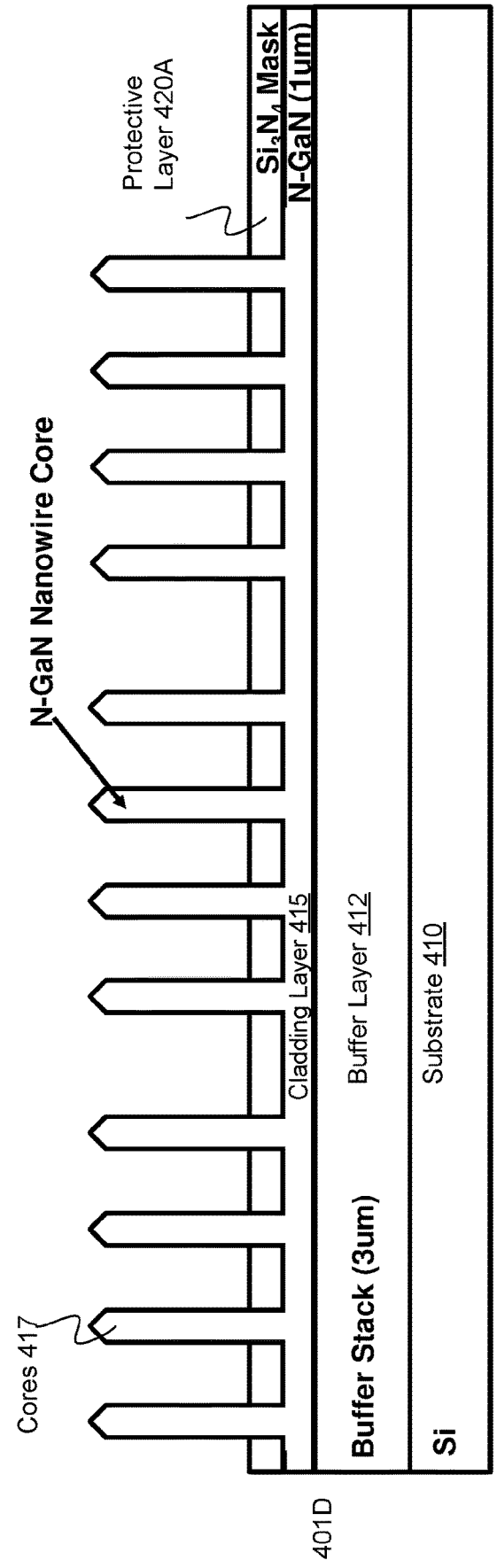

In FIG. 4B, wafer 401C illustrates multiple trenches 416 formed in protective layer 420A. The trenches 416 may remove an area of the protective layer 420A to expose the cladding layer 415 in the area of trenches 416. In one implementation, nanometer lithography may be used to open trenches 416 in protective layer 420A. The width of the trenches 416 may be 70 nanometers (nm) to 100 nm in width. Nanowire LEDs may be formed in trenches 416. The width of the trenches 416 may be referred to as the minimum feature size of a nanowire LED.

Wafer 401D illustrates the formation of cores 417 in trenches 416. Cores 417 are disposed above cladding layer 415. Cores 417 may be grown in the corresponding trenches 416. Core 417 may have material characteristics of cladding layer 415. For example, cladding layer 415 may be a seed layer and an N—GaN core 417 may be grown on an N—GaN cladding layer 415, and so forth. In one implementation, core 417 may be InGaN with Indium content of approximately 10% with a tolerance of ±3%. In some implementations, cores 417 may have an Indium content in the range of approximately 10% to 20% with a tolerance of ±3%. In implementations, cores 417 with Indium content may be grown using Hydrazine. Growing cores 417 with Indium content may help facilitate the grown (e.g., reduced lattice mismatch) of subsequent layers, e.g., such as the MQW.

Figure 4C:
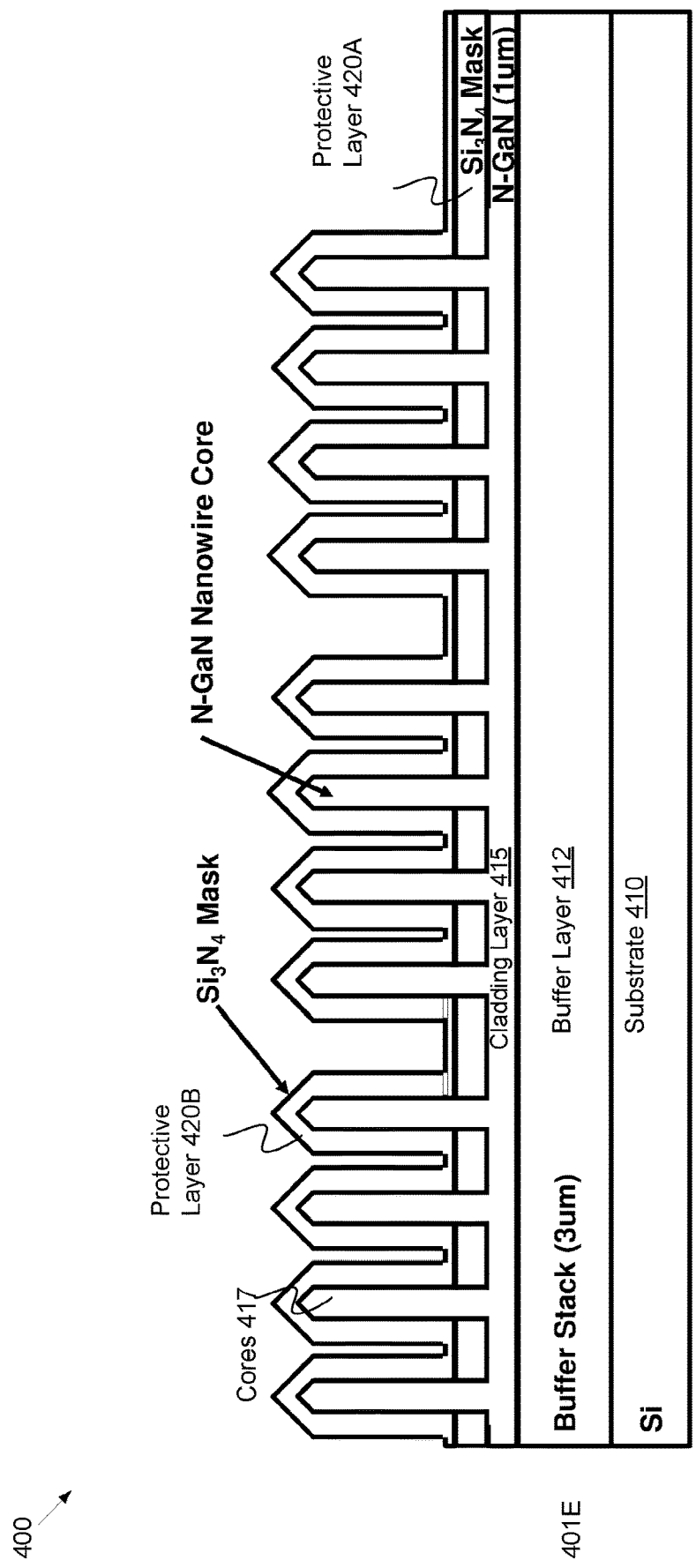

In FIG. 4C, wafer 401E illustrates a protective layer 420B (e.g., second protective layer) that is disposed or deposited above cores 417 and protective layer 420A. Protective layer 420B may be a similar or different material than protective layer 420A, and have similar features as described with respect to protective layer 420A.

Figure 4D:
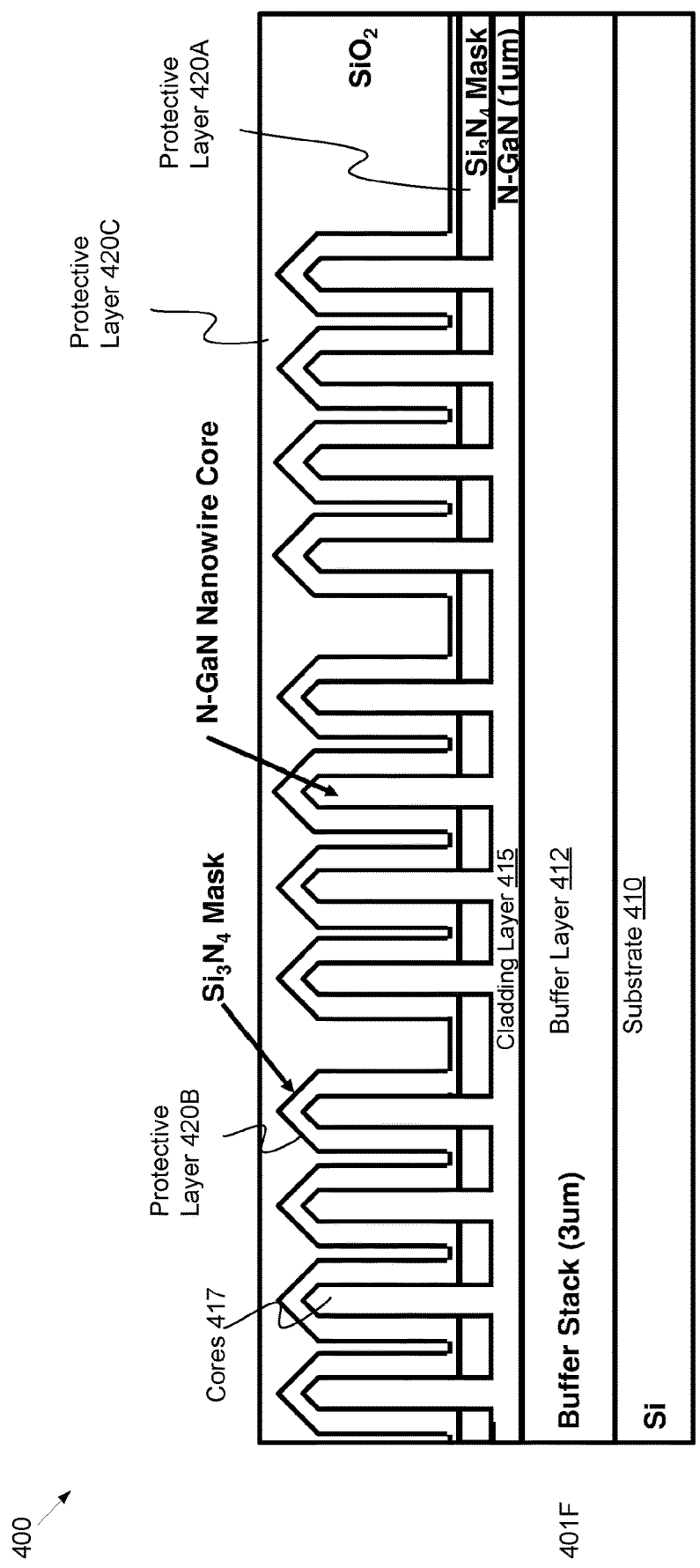

In FIG. 4D, wafer 401F illustrates a protective layer 420C (e.g., third protective layer) that is disposed or deposited above protective layer 420B. Protective layer 420C may be a similar or different material than protective layer 420A, and have similar features as described with respect to protective layer 420A. Protective layer 420C may be planarized after deposition.

Figure 4E:
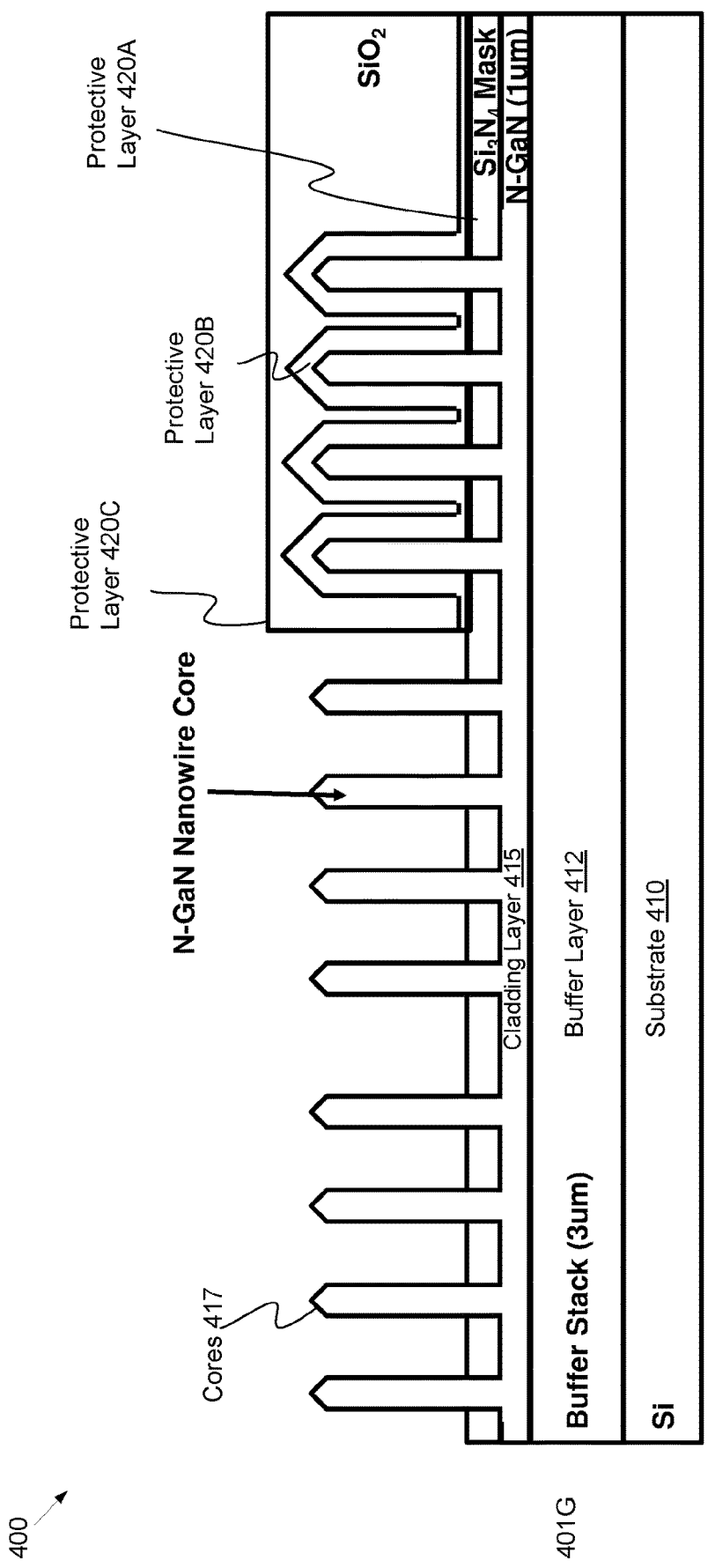

In FIG. 4E, wafer 401G illustrates the exposure of a first subset and second subset of cores 417. As shown by wafer 401G, the protective layer 420C above the first subset of cores 417 (e.g., first four cores 417 from left to right) and a second subset of cores 417, (e.g., 5$^{th}$ to 8$^{th}$ cores 417 from left to right) is removed (e.g., patterned), while protective layer 420C above a third subset of cores 417 (last four cores 417 left to right) is not removed. It may be noted that a resist layer (not shown) may be used above the third subset of cores 417 (e.g., above which protective layer 420C is not removed) to aid in the patterning process. Protective layer 420B is removed (e.g., etched) above the first subset and second subset of cores 417, and not removed above the third subset of cores 417. It may be noted that removal of protective layers above the first subset of cores 417 and second subset of cores 417 may be performed in different process, in some implementations.

Figure 4F:
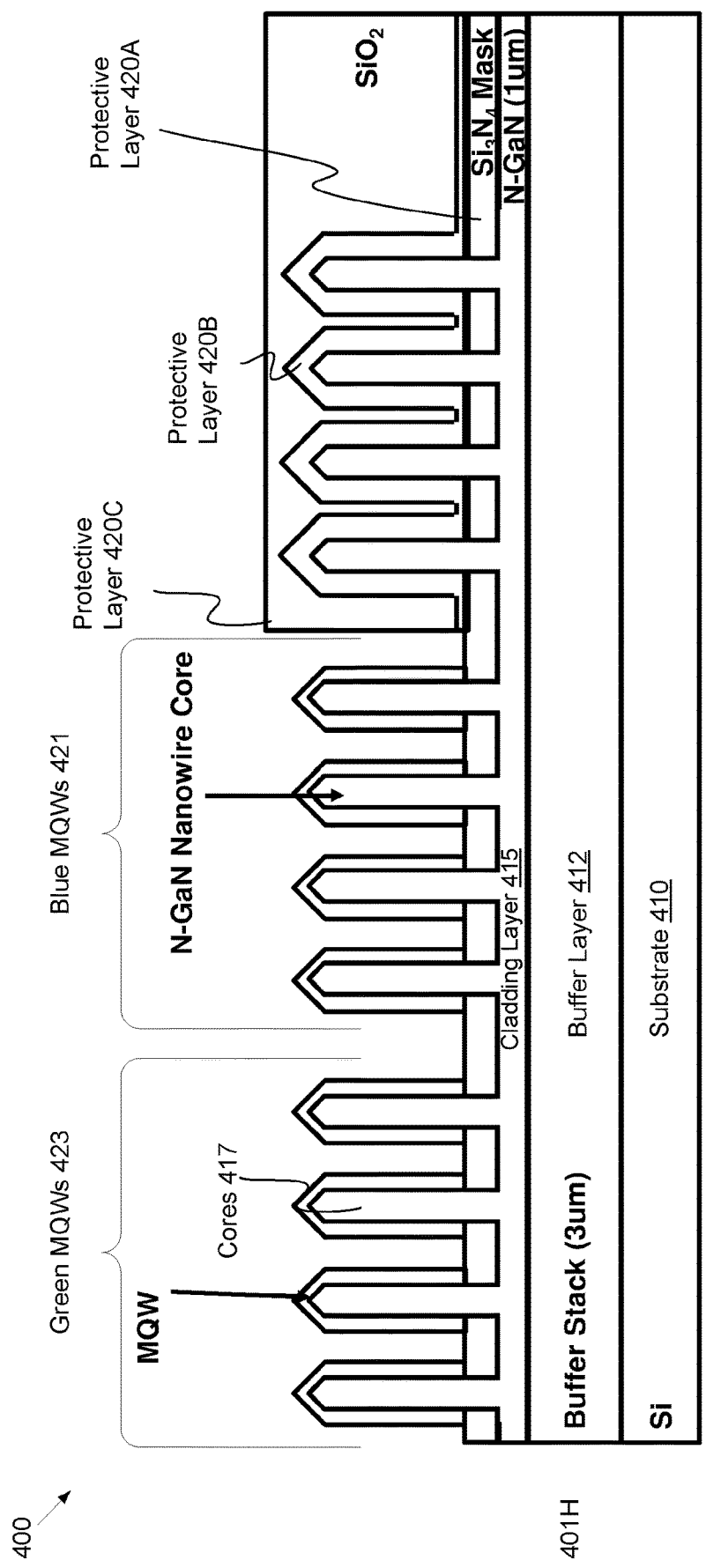

In FIG. 4F, wafer 401H illustrates a formation of blue multiple quantum wells (MQW) 421 disposed above the first subset of cores 417 using Hydrazine. Blue MQWs 421 are disposed or grown above the first subset of cores 417. As described above, a MQW, such as blue MQWs 421, may include multiple layers and a specific Indium content to produce a corresponding color electroluminescence. In some implementations, Hydrazine may be used to grow one or more Indium Gallium Nitride layers of the blue MQWs 421.

Wafer 401H also illustrates a formation of a green multiple quantum wells (MQWs) 423 disposed above the second subset of cores 417. Green MQWs 423 are disposed or grown above the second subset of cores 417. As described above, a MQW, such as green MQWs 423, may include multiple layers and a specific Indium content to produce a corresponding color electroluminescence. In some implementations, Hydrazine may be used to grow one or more Indium Gallium Nitride layers of the green MQWs 423. It may be noted that the growth of green MQWs 423 and blue MQWs 421 above the first subset of cores 417 and second subset of cores 417, respectively, may be performed in different process, in some implementations.

Figure 4G:
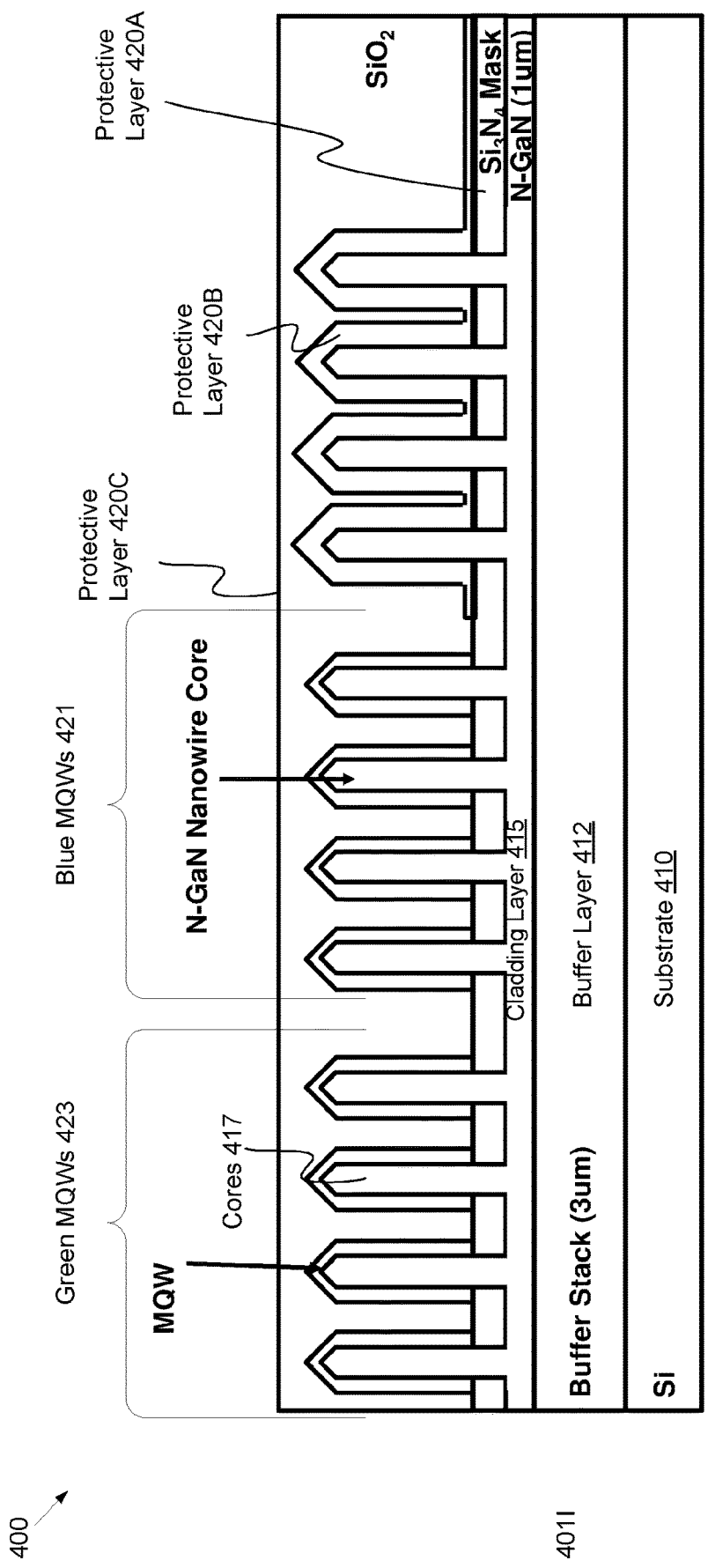
Figure 4H:
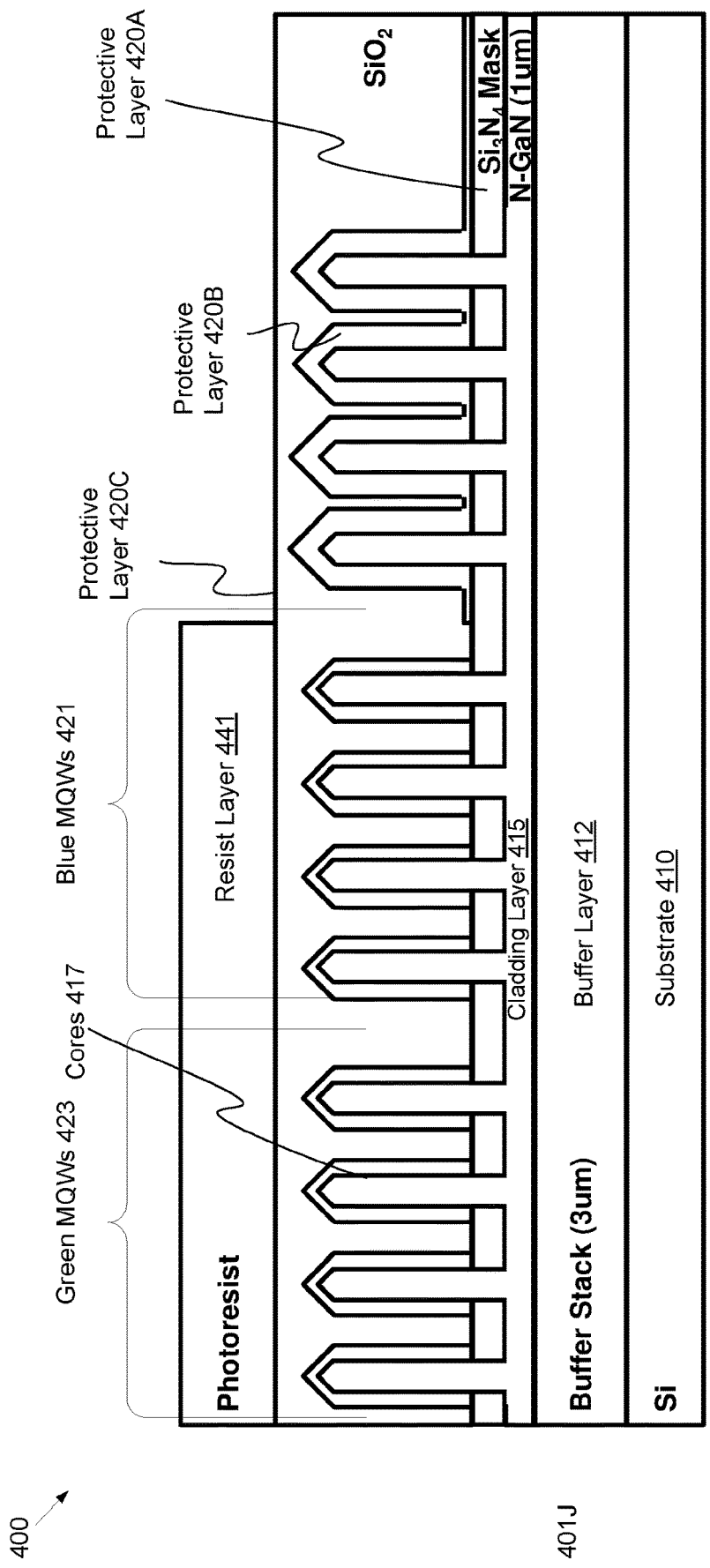

In FIG. 4G, wafer 401I illustrates another protective layer (e.g., fourth protective layer) that may be disposed or deposited above protective layer 420C, green MQWs 423, and blue MQWs 421, and planarized. For the sake of convenience the fourth protective layer may also be referred to as protective layer 420C, but it may be noted that some portion of protective layer 420C (e.g., above green MQWs 423 and blue MQWs 421) may be formed from a subsequent process as described with respect to FIG. 4D In FIG. 4H, wafer 401J illustrates a resist layer 441 disposed above a portion of protective layer 420C, where the portion of protective layer 420C includes an area above green MQWs 423 and blue MQWs 421.

Figure 4I:
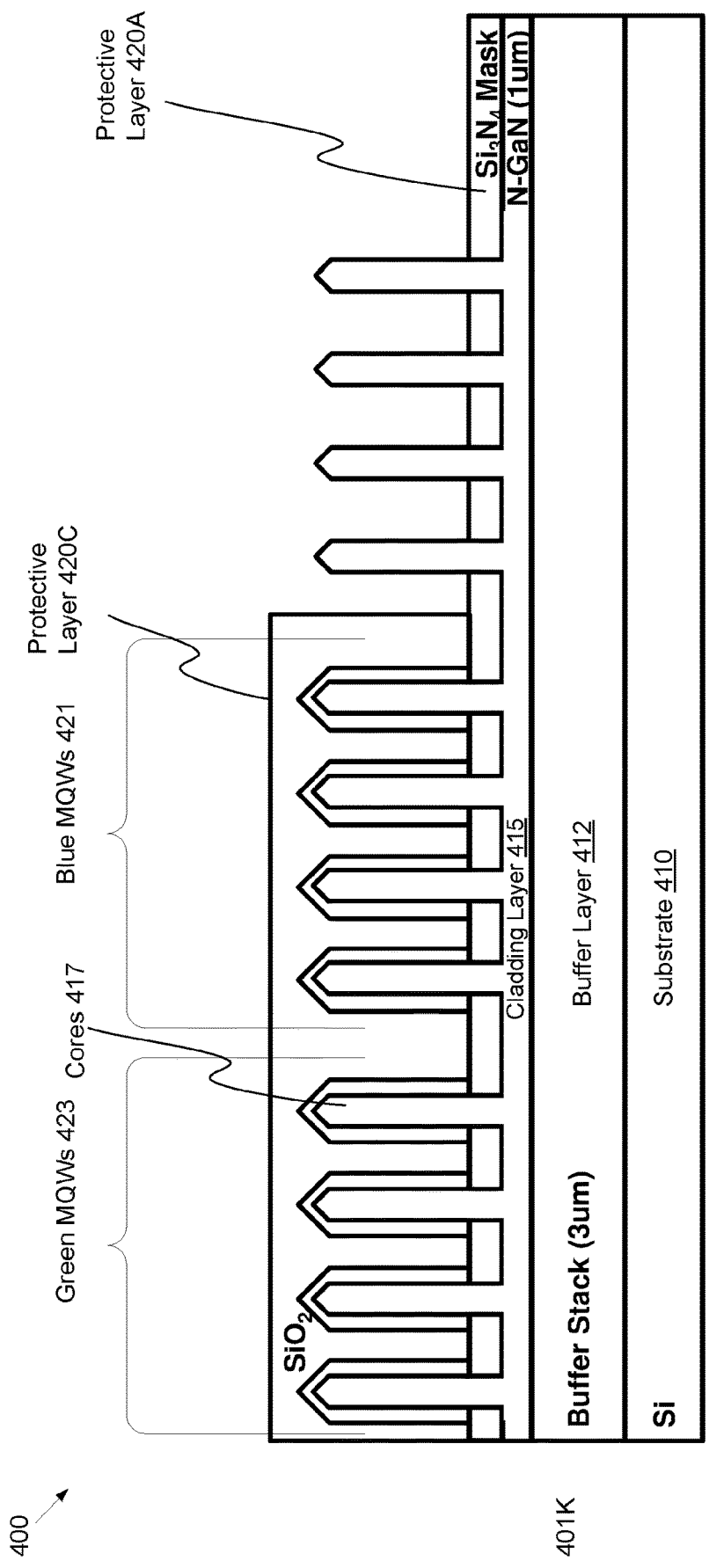

In FIG. 4I, wafer 401K illustrates the exposure of the third subset of cores 417. As shown by wafer 401K, the protective layer 420C above the third subset of cores 417 is removed (e.g., patterned) using the resist layer 441, while protective layer 420C above the first subset and the second subset of cores 417 (e.g., green MQWs 423 and blue MQWs 421) is not removed. Resist layer 441 may be removed. Protective layer 420B is removed (e.g., etched) from the third subset of cores 417, and not removed above the first subset and the second subset of cores 417.

Figure 4J:
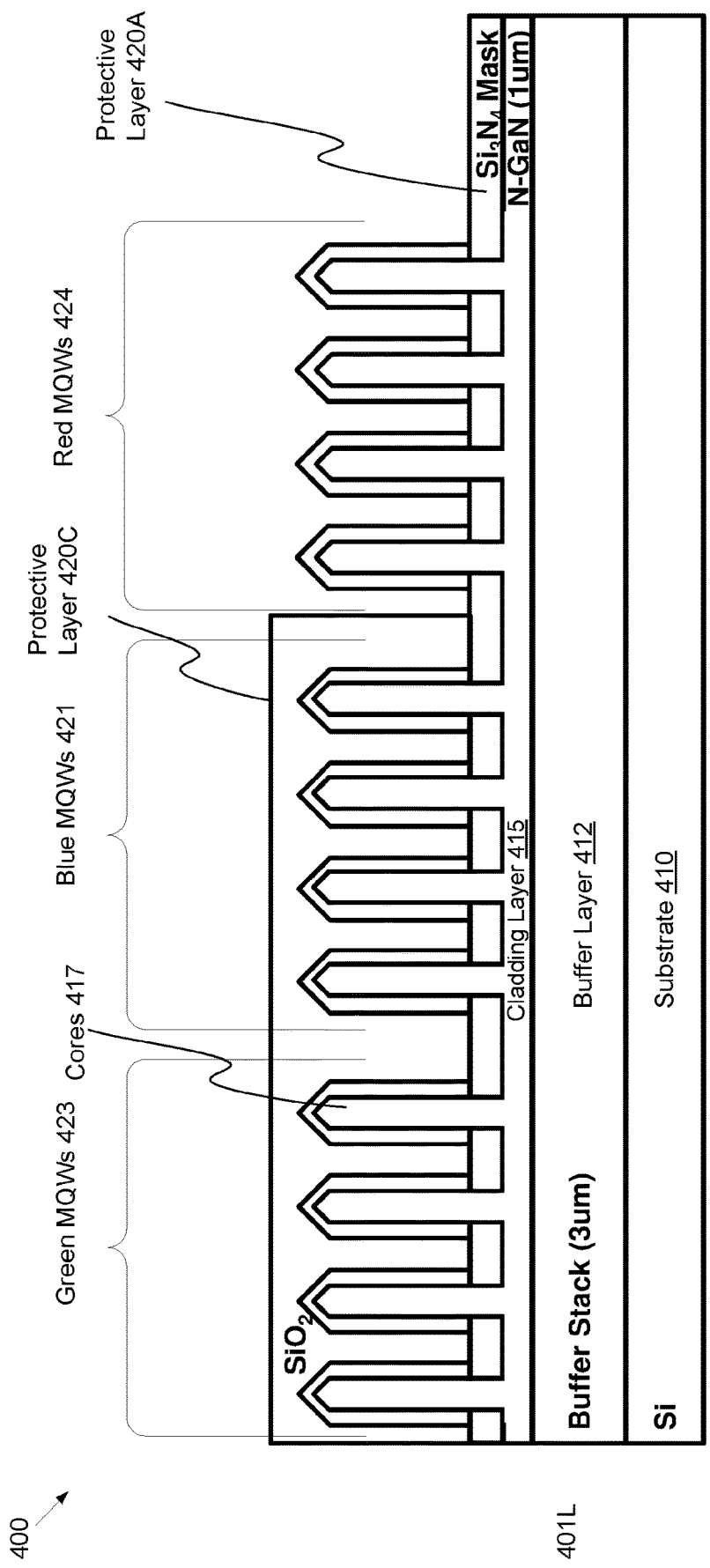

In FIG. 4J, wafer 401L illustrates the formation of red multiple quantum wells (MQWs) 424 disposed above the third subset of cores 417 using Hydrazine. Red MQWs 424 are disposed or grown above the third subset of cores 417. As described above, a MQW, such as red MQWs 424, may include multiple layers and a specific Indium content to produce a corresponding color electroluminescence. In some implementations, Hydrazine may be used to grow one or more Indium Gallium Nitride layers of the red MQWs 424. As noted above, using Hydrazine to grow Indium Gallium Nitride layers of the red MQWs 424 may improve quality of the red LED, such as a red nanowire LED.

Figure 4K:
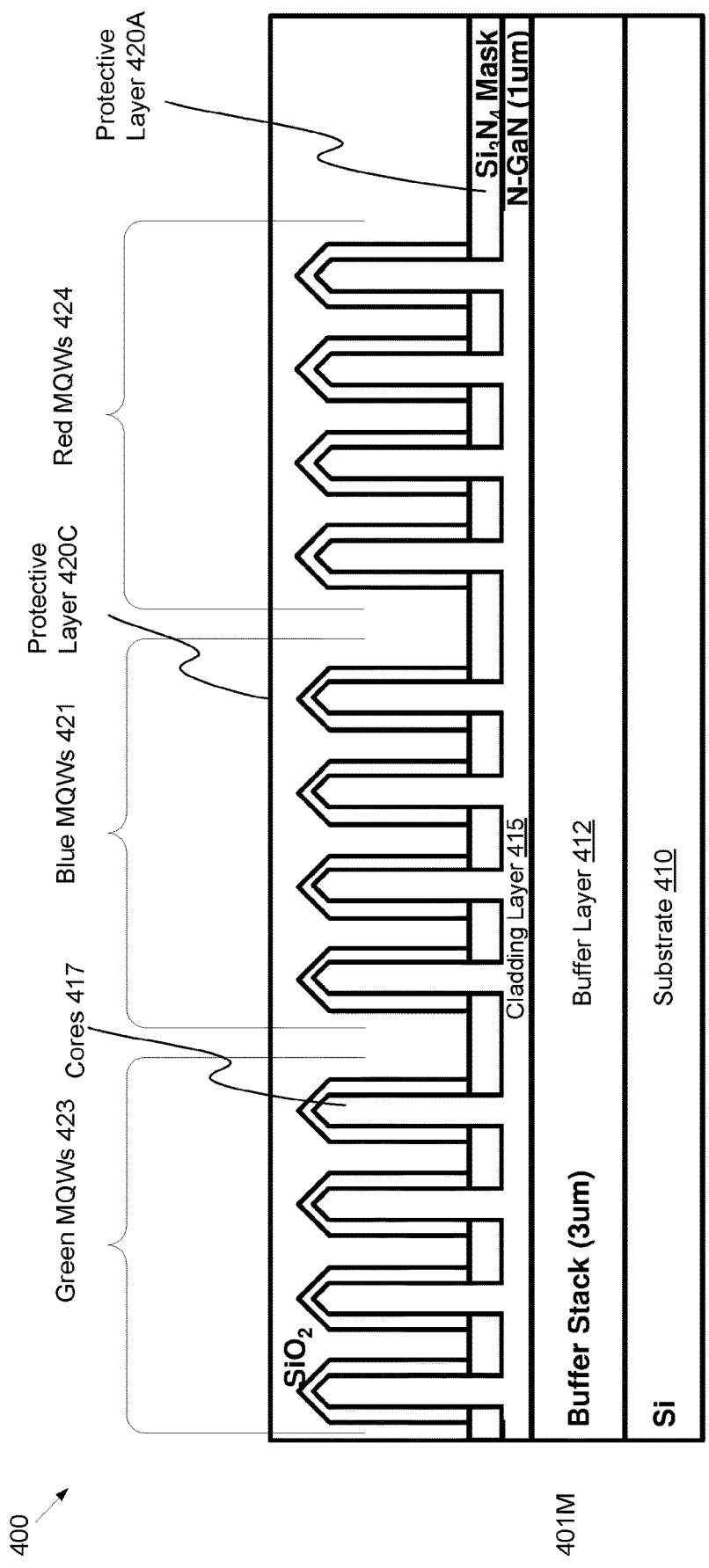

In FIG. 4K, wafer 401M illustrates another protective layer (e.g., fifth protective layer) that may be disposed or deposited above protective layer 420C, red MQWs 424, and planarized. For the sake of convenience the fifth protective layer may also be referred to as protective layer 420C, but it may be noted that some portion of protective layer 420C (e.g., above red MQWs 424) may be formed from a subsequent process as described with respect to FIG. 4G.

Figure 4L:
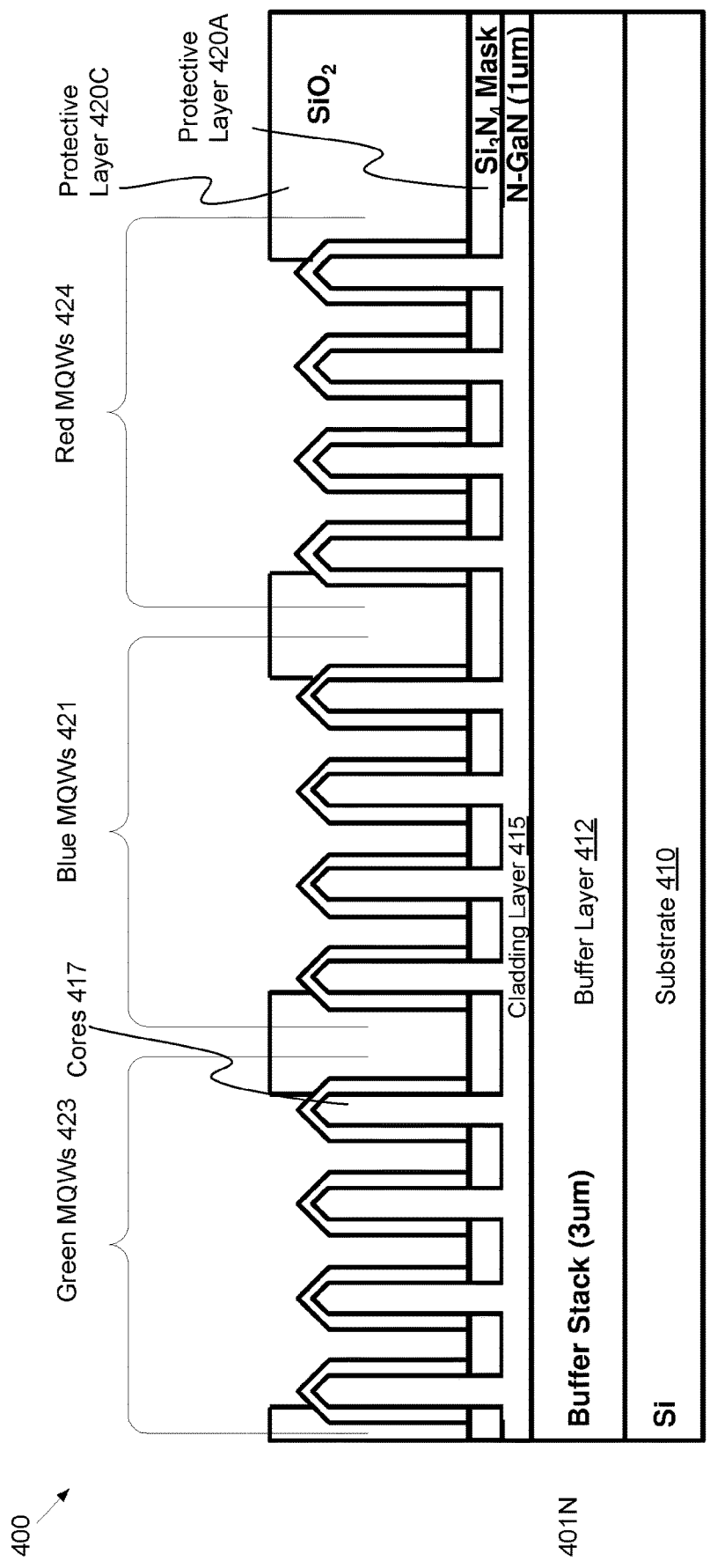

In FIG. 4L, wafer 401N illustrates trenches (also referred to as "holes" herein) formed above the red MQWs 424, blue MQWs 421, and green MQWs 423. In one implementation, protective layer 420C above the red MQWs 424, blue MQWs 421, and green MQWs 423 may be removed or etched to expose the corresponding MQWs.

Figure 4M:
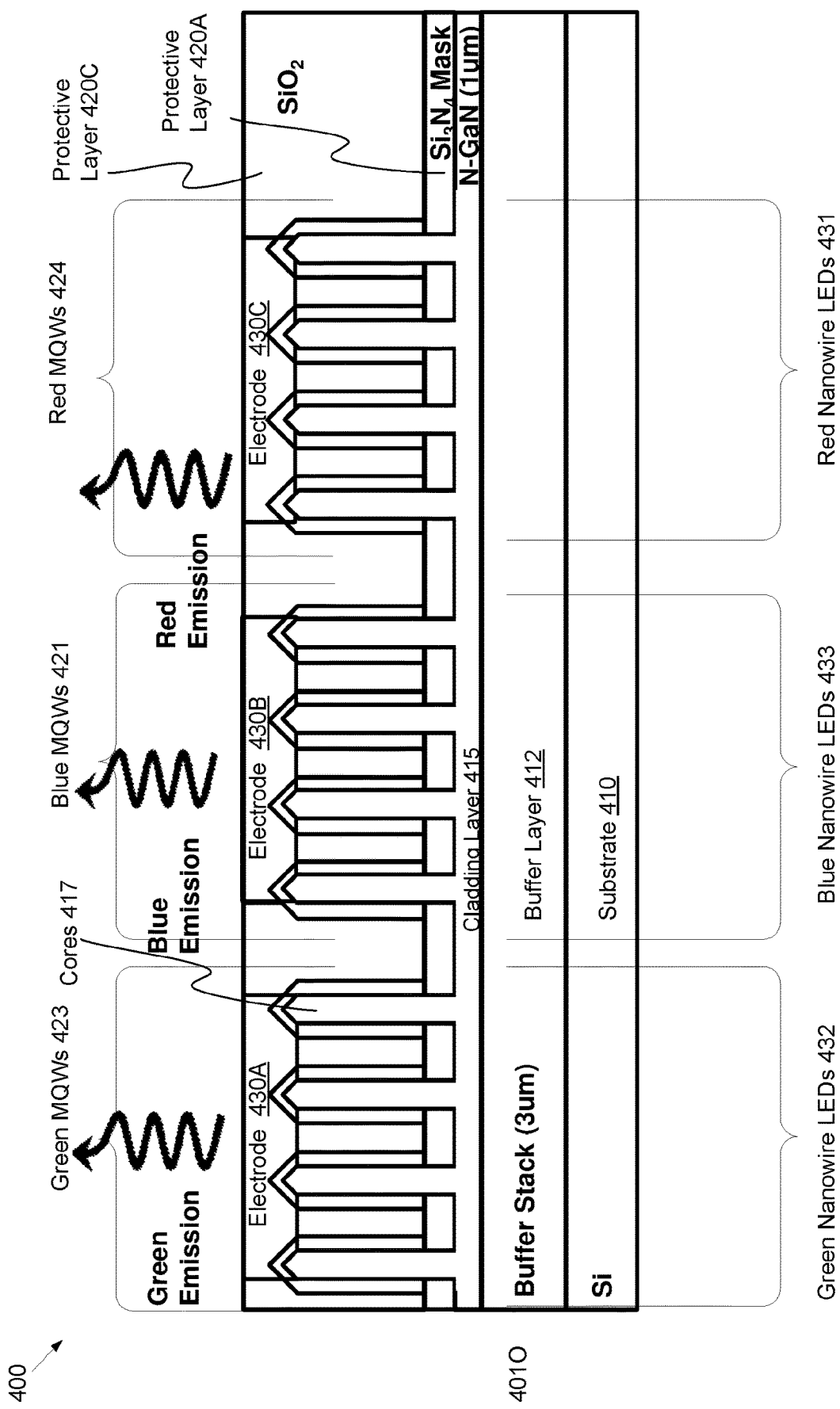

In FIG. 4M, wafer 401O illustrates transparent electrodes 430 formed above the MQWs of red nanowire LEDs 431, the green nanowire LEDs 432, and the blue nanowire LEDs 433. Transparent electrode 430 is disposed or deposited over the red nanowire LEDs 431, the green nanowire LEDs 432, and the blue nanowire LEDs 433 to allow the emission of light to radiate in a direction opposite substrate 410. In one implementation, transparent electrode 430 may be Indium-Tin-Oxide (ITO). Transparent electrode 430 may be a variety of materials including one or more of ITO or Zinc Oxide or other appropriate conductive transparent material.

It may be noted that a yellow nanowire LEDs (not shown) may be formed in a similar manner as described with respect to the FIGS. 4A-4M.

In some implementations, a conductive contact, such as a metal contact, may be formed to connect to cladding layer 415. For example, a metal contact may be formed through protective layer 420C and 420A to cladding layer 415. The conductive contact may be shared between the blue nanowire LEDs 433, the green nanowire LEDs 432, and the red nanowire LEDs 431 of the monolithic multi-color light emitting diode (LED) pixel and connect to a supply voltage (not shown) to activate the nanowire LEDs. It may be noted that in a non-monolithic LED pixel the LEDs may not share a conductive contact. In some implementations, the cladding layer 415 may be the common contact shared by the between the blue nanowire LEDs 433, the green nanowire LEDs 432, and the red nanowire LEDs 431 of the monolithic multi-color light emitting diode (LED) pixel.

In some implementations, the conductive contact may connect to cladding layer 415 through the backside (e.g., from the direction of substrate 410). For example, the bottom of wafer 401 may be removed to expose the cladding layer 415. The cladding layer 415 may be placed on pads on the TFT backplane. In some implementations, an etch may be applied to separate the cladding layer 415 associated with different color LEDs of a monolithic multi-color light emitting diode (LED) pixel, so that the color LED may be individually controlled.

It may be noted that a monolithic multi-color LED pixel may include two or more different color nanowire LEDs. For example, wafer 401O shows a monolithic multi-color LED pixel including the blue nanowire LEDs 433, the green nanowire LEDs 432, and the red nanowire LEDs 431.

It may be noted that the blue nanowire LEDs 433, the green nanowire LEDs 432, and the red nanowire LEDs 431 of the monolithic multi-color LED pixel are surrounded (e.g., contiguous and without a boundary) by a protective layer 420A and 420C. It may be noted that a non-monolithic multi-color LED pixel may have different color LEDs that are diced separately and later integrated on a backplane to form a pixel. The associated protective layers of a non-monolithic multi-color LED pixel may not be contiguous and may have a boundary between two LEDs of a pixel.

Figure 5:
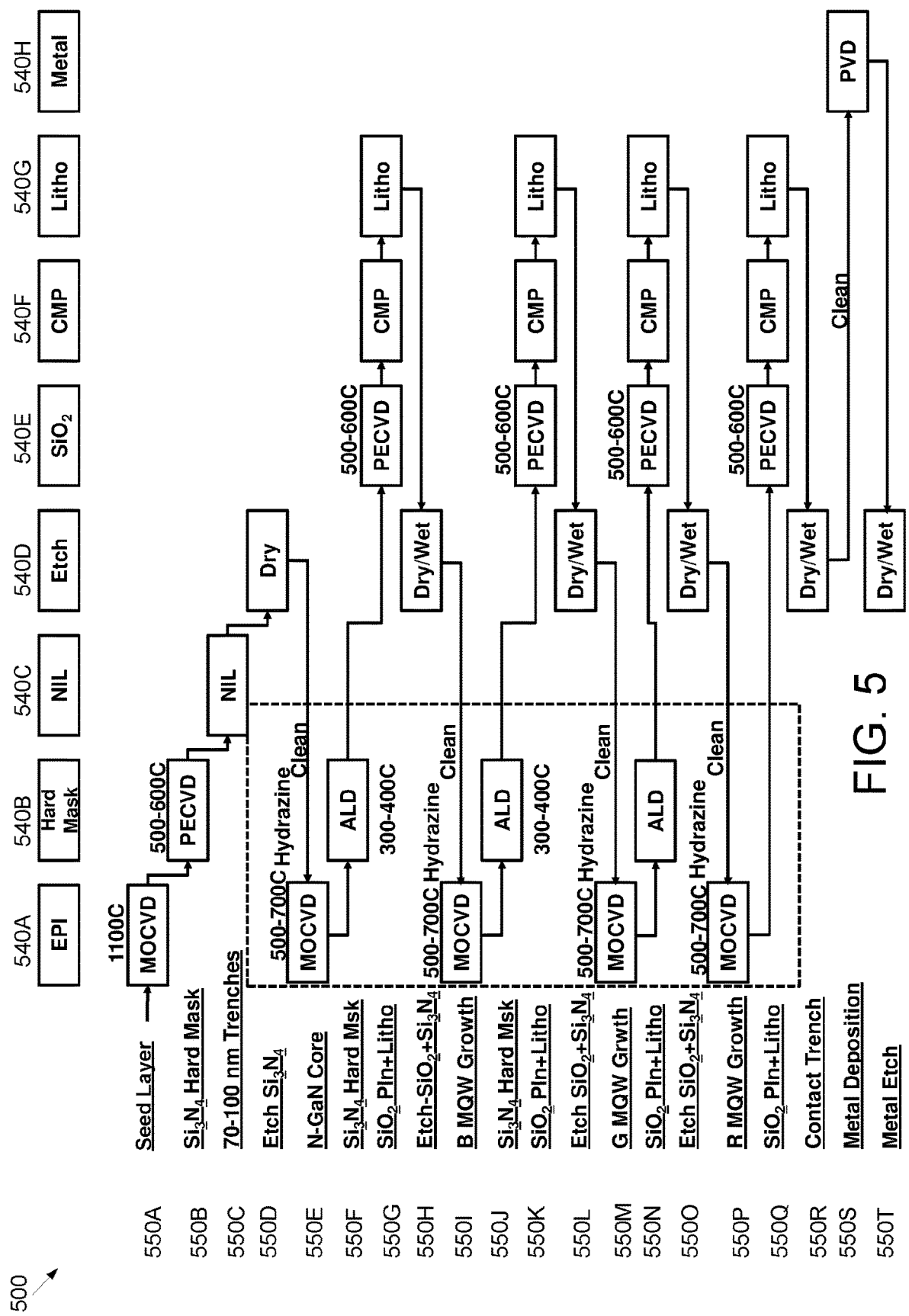
FIG. 5 illustrates a process flow for fabricating monolithic multi-color LED pixels using nanowire light emitting diodes on a wafer, according to another implementation.

FIG. 5 illustrates a process flow for fabricating monolithic multi-color LED pixels using nanowire light emitting diodes on a wafer, according to another implementation. The horizontal row of process flow 500 shows different fabrication processes 540, and the vertical row shows different wafer processes 550. Fabrication process 540A may include epitaxy (EPI). Epitaxy may be the deposition of one or more epitaxial films or layers. For example, an epitaxial process may include metal organic chemical vapor deposition (MOCVD) performed at a variety of temperatures, using Hydrazine or Ammonia. Fabrication process 540B may include a hard mask process where a material is used as an etch mask. For example, a hard mask process may include plasma-enhanced chemical vapor deposition (PECVD) or atomic layer deposition (ALD). Fabrication process 540C may include a nanometer lithography process. For example, a nanometer lithography process may include photolithography or nanoimprint lithography (NIL). Fabrication process 540D may include an etching process to remove one or more layers (or parts of one or more layers) from the surface of a wafer. The etching process may include dry etch or wet etch. Fabrication process 540E may include a protective layer process, and may include the deposition of materials such as Silicon Dioxide ($SiO_2$). Fabrication process 540F may include a planarization process to smooth the surface of the wafer. The planarization process may include chemical-mechanical planarization (CMP). Fabrication process 540G may include a photolithography process that uses light to pattern features on the wafer. Fabrication process 540H may include a metallization process to form connections to the circuits, such as multi-color LED pixels. The metallization process may include physical vapor deposition (PVD). It may be noted that fabrication processes 540 have been described for purposes of illustration rather than limitation. It may be further noted that the same, fewer or additional fabrication processes may be used. It also may be noted that the same or different processes as described may be used to perform the various fabrication processes 540.

A wafer may start at wafer process 550A undergo the various wafer processes 550A through 550T. Wafer processes 550 align with different fabrication processes 540. For example, wafer process 550A includes a seeding process to form a seed layer (e.g., cladding layer), such as N—GaN. Fabrication process 540A, such as MOCVD, may be used to form the seed layer. Wafer process 550A may be further described with respect to wafer 401A of FIG. 4A. Wafer process 550B may include the formation of a hard mask layer. Wafer process 550B may be further described with respect to wafer 401B of FIG. 4A. Wafer process 550C and 550D may include the formation of trenches for the nanowire cores. Wafer process 550C-550D may be further described with respect to wafer 401C of FIG. 4B. Wafer process 550E may include the formation of the nanowire cores using Hydrazine in and above the trenches. Wafer process 550E may be further described with respect to wafer 401D of FIG. 4B. Wafer process 550F may include the formation a protective layer. Wafer process 550F may be further described with respect to wafer 401E of FIG. 4C. Wafer process 550G may include the deposition, planarization, and lithography of a protective layer. Wafer process 550G may be further described with respect to wafer 401F of FIG. 4D. Wafer process 550H may include the etching of the previously disposed protective layers. Wafer process 550H may be further described with respect to wafer 401G of FIG. 4E. Wafer process 550I may include the formation of the blue MQWs using Hydrazine. Wafer process 550J may include the formation a protective layer. Wafer process 550K may include the deposition, planarization, and lithography of another protective layer. Wafer process 550L may include the etching of the previously disposed protective layers. Wafer process 550M may include the formation of the green MQWs using Hydrazine. Wafer processes 550I-550M may be further described with respect to wafer 401H of FIG. 4F. It may be noted that subsequent wafer process 550M, a protective layer may be deposited (e.g., ALD). Wafer process 550N may include the deposition, planarization, and lithography of another protective layer. Wafer processes 550N may be further described with respect to wafer 401I of FIG. 4G and wafer 401J of FIG. 4H. Wafer process 550O may include the etching one or more protective layers. Wafer processes 550O may be further described with respect to wafer 401K of FIG. 4I. Wafer process 550P may include the formation of the red MQWs using Hydrazine. Wafer processes 550P may be further described with respect to wafer 401L of FIG. 4J. Wafer process 550Q may include the deposition, planarization, and lithography of another protective layer. Wafer processes 550Q may be further described with respect to wafer 401M of FIG. 4K.

Wafer process 550R may include forming trenches for a conductive contact to the MQWs of the red nanowire LEDs, blue nanowire LEDs, and green nanowire LEDs. Wafer processes 550R may be further described with respect to wafer 401N of FIG. 4L. Wafer process 550S may include depositing the conductive contact material (e.g., electrode) in the trenches. Wafer process 550T may include an etch process to etch conductive contact. Wafer processes 550R may be further described with respect to wafer 401O of FIG. 4M.

It may be noted that wafer processes 550 have been described for purposes of illustration rather than limitation. It may be further noted that the same, fewer or additional wafer processes may be used. It also may be noted that the same or different materials as described or illustrated may be used to in the various wafer processes 550.

Figure 6:
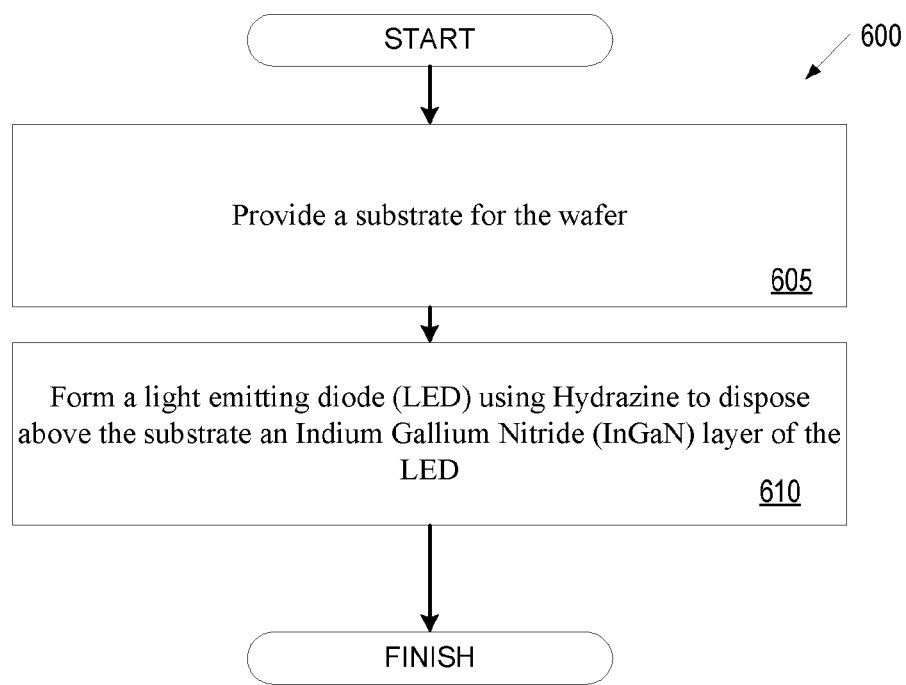
FIG. 6 is a flow diagram of a fabrication process for a monolithic multi-color light emitting diode pixel with nanowire light emitting diodes, according to an implementation.

FIG. 6 is a flow diagram of a fabrication process for a monolithic multi-color light emitting diode pixel with nanowire light emitting diodes, according to an implementation. It may be noted that features of FIGS. 2A-2H may be described below to help illustrate method 600. It may be noted that features of FIGS. 4A-4M may also be applied to method 600. Method 600 may be performed as operations. It may be noted that method 600 may be performed in any order and may include the same, more, or fewer operations. It may be noted that method 600 may be performed by one or more pieces of semiconductor fabrication equipment or fabrication tools.

Method 600 begins at operation 605 that provides a substrate 210 for the wafer 201. At operation 610, a light emitting diode (LED) is formed using Hydrazine to dispose above the substrate an Indium Gallium Nitride (InGaN) layer of the LED. In some implementations, a monolithic multi-color light emitting diode (LED) pixel may be formed above the substrate 210 of the wafer 201. The monolithic multi-color LED pixel includes a blue LED, a green LED, and a red LED. Hydrazine may be used to dispose the Indium Gallium Nitride (InGaN) layer of at least the red LED of the monolithic multi-color LED pixel. A multiple quantum well (MQW) of the LED, such as the red LED, is formed using the Hydrazine. The MQW includes at least one Indium Gallium Nitride (InGaN) layer formed using Hydrazine. In other implementations, the micro pyramid of a micro pyramid LED or the core of a nanowire LED is formed using Hydrazine.

Additional details of method 600 may be described at least with respect to FIG. 2A-2H and FIGS. 4A-4M.

Figure 7:
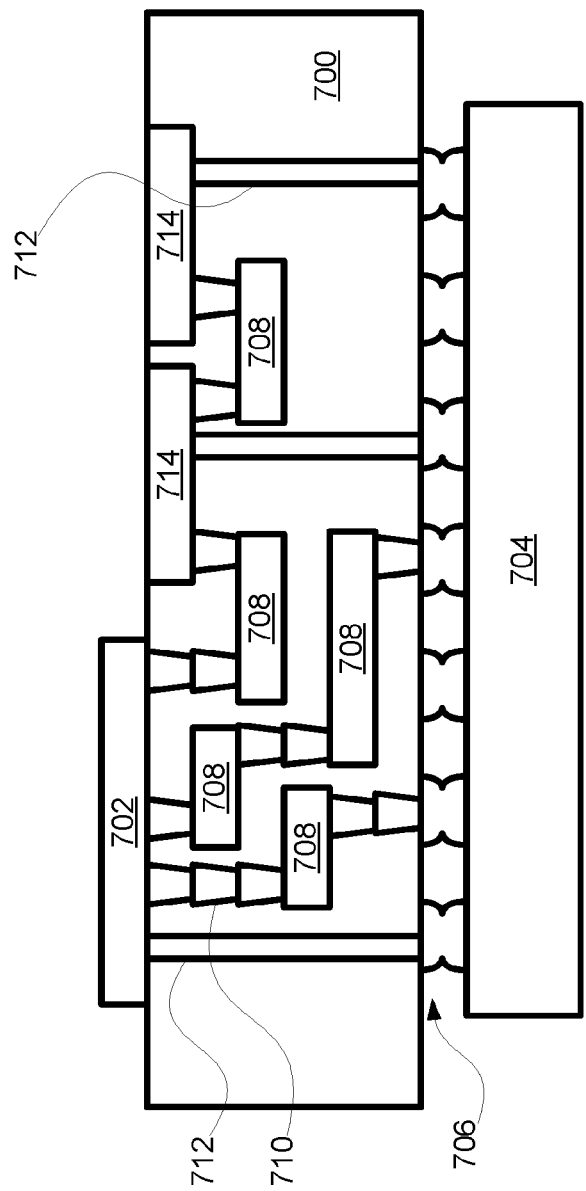
FIG. 7 illustrates an interposer, according to implementations.

FIG. 7 illustrates an interposer, according to implementations. The interposer 700 may be an intervening substrate used to bridge a first substrate 702 to a second substrate 704. The first substrate 702 may be, for instance, an integrated circuit die, such as a multi-color LED pixel. The second substrate 704 may be, for instance, a memory module, a computer motherboard, backplane, or another integrated circuit die. In one implementation, first substrate 702 may be an integrated circuit die described with respect to FIG. 2A-2H and FIG. 4A-4M. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some implementations, the first and second substrates 702/704 are attached to opposing sides of the interposer 700. In other implementations, the first and second substrates 702/704 are attached to the same side of the interposer 700. In further implementations, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with one or more implementations, apparatuses or processes disclosed herein may be used in the fabrication of interposer 700.

Figure 8:
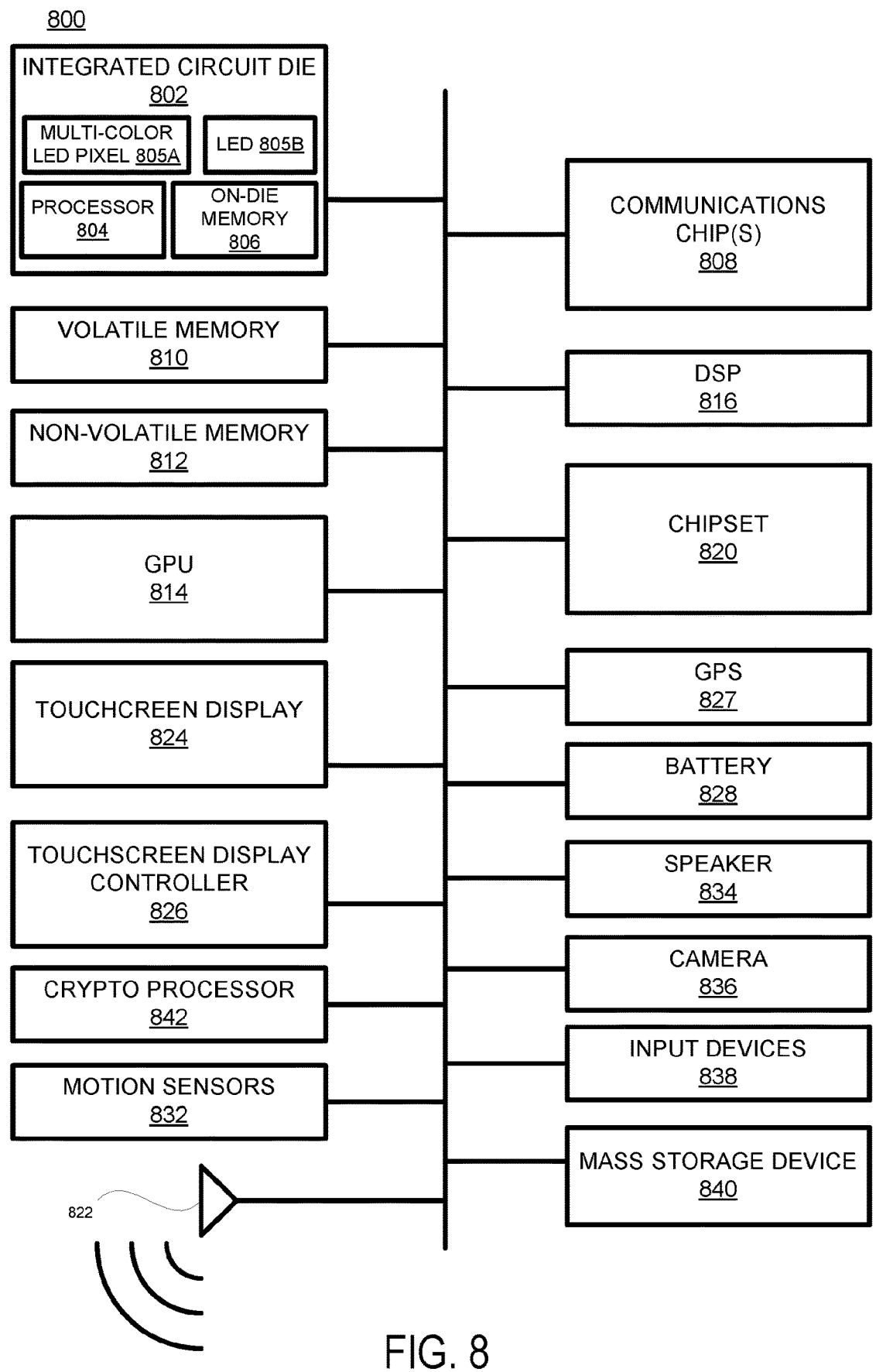
FIG. 8 is a computing device built in accordance implementation of the present disclosure.

FIG. 8 is a computing device built in accordance implementation of the present disclosure. The computing device 800 may include a number of components. In one implementation, the components are attached to one or more motherboards. In an alternate implementation, some or all of these components are fabricated onto a single system-on-a-chip (SoC) die, such as an SoC used for mobile devices. The components in the computing device 800 include, but are not limited to, an integrated circuit die 802 and at least one communications logic unit 808. In some implementations the communications logic unit 808 is fabricated within the integrated circuit die 802 while in other implementations the communications logic unit 808 is fabricated in a separate integrated circuit chip that may be bonded to a substrate or motherboard that is shared with or electronically coupled to the integrated circuit die 802. The integrated circuit die 802 may include a CPU 804 as well as on-die memory 806, often used as cache memory that can be provided by technologies such as embedded DRAM (eDRAM), SRAM, or spin-transfer torque memory (STT-MRAM). It may be noted that in implementations integrated circuit die 802 may include fewer elements (e.g., without processor 804 and/or on-die memory 806) or additional elements other than processor 804 and on-die memory 806. In one example, integrated circuit die 802 may be an LED, such as a monolithic multi-color LED pixel 805A or non-monolithic LED 805B, with or without processor 804 and/or on-die memory 806. In another example, integrated circuit die 802 may be LED display with multiple monolithic multi-color LED pixels 805A (or multiple LEDs 805B) and a TFT backplane, with or without processor 804 and/or on-die memory 806. In another example, integrated circuit die 802 may include some or all the elements described herein, as well as include additional elements.

Computing device 800 may include other components that may or may not be physically and electrically coupled to the motherboard or fabricated within an SoC die. These other components include, but are not limited to, volatile memory 810 (e.g., DRAM), non-volatile memory 812 (e.g., ROM or flash memory), a graphics processing unit 814 (GPU), a digital signal processor 816, a crypto processor 842 (e.g., a specialized processor that executes cryptographic algorithms within hardware), a chipset 820, at least one antenna 822 (in some implementations two or more antenna may be used), a display or a touchscreen display 824 (e.g., that may include integrated circuit die 802), a touchscreen controller 826, a battery 828 or other power source, a power amplifier (not shown), a voltage regulator (not shown), a global positioning system (GPS) device 827, a compass (not shown), a motion coprocessor or sensors 832 (that may include an accelerometer, a gyroscope, and a compass), a microphone (not shown), a speaker 834, a camera 836, user input devices 838 (such as a keyboard, mouse, stylus, and touchpad), and a mass storage device 840 (such as hard disk drive, compact disk (CD), digital versatile disk (DVD), and so forth). The computing device 800 may incorporate further transmission, telecommunication, or radio functionality not already described herein. In some implementations, the computing device 800 includes a radio that is used to communicate over a distance by modulating and radiating electromagnetic waves in air or space. In further implementations, the computing device 800 includes a transmitter and a receiver (or a transceiver) that is used to communicate over a distance by modulating and radiating electromagnetic waves in air or space.

The communications logic unit 808 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some implementations they might not. The communications logic unit 808 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 800 may include a plurality of communications logic units 808. For instance, a first communications logic unit 808 may be dedicated to shorter range wireless communications such as Wi-Fi, NFC, and Bluetooth and a second communications logic unit 808 may be dedicated to longer range wireless communications such as GPS, EDGE, GPRS, CDMA, WiMAX, LTE, Ev-DO, and others.

The processor 804 (also referred to "processing device" herein) of the computing device 800 includes one or more devices, such as transistors, RF filters, or LEDs, that are formed in accordance with implementations of the present disclosure. The term "processor" or "processing device" may refer to any device or portion of a device that processes electronic data from registers and/or memory to transform that electronic data into other electronic data that may be stored in registers and/or memory. Processor 804 represents one or more general-purpose processing devices such as a microprocessor, a central processing unit, or the like. More particularly, the processor 804 may be complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 804 may also be one or more special-purpose processing devices such as an application specific integrated circuit (ASIC), a field programmable gate array (FPGA), a digital signal processor (DSP), network processor, or the like.

The communications logic unit 808 may also include one or more devices, such as transistors, RF filters, or LEDs, that are formed in accordance with implementations of the present disclosure.

In further implementations, another component housed within the computing device 800 may contain one or more devices, such as transistors, RF filters, or LEDs, that are formed in accordance with implementations of the present disclosure.

In various implementations, the computing device 800 may be a laptop computer, a netbook computer, a notebook computer, an ultrabook computer, a smartphone, a dumbphone, a tablet, a tablet/laptop hybrid, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

Various operations are described as multiple discrete operations, in turn, in a manner that is most helpful in understanding the present disclosure, however, the order of description should not be construed to imply that these operations are necessarily order dependent. In particular, these operations need not be performed in the order of presentation.

The terms "over," "above" "under," "between," and "on" as used herein refer to a relative position of one material layer or component with respect to other layers or components. For example, one layer disposed above or over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to Germanium, Indium Antimonide, Lead Telluride, Indium Arsenide, Indium Phosphide, Gallium Arsenide, Indium Gallium Arsenide, Gallium Antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as Hafnium, Silicon, Oxygen, Titanium, Tantalum, Lanthanum, Aluminum, Zirconium, Barium, Strontium, Yttrium, Lead, Scandium, Niobium, and Zinc. Examples of high-k materials that may be used in the gate dielectric layer include, but are not limited to, Hafnium Oxide, Hafnium Silicon Oxide, Lanthanum Oxide, Lanthanum Aluminum Oxide, Zirconium Oxide, Zirconium Silicon Oxide, Tantalum Oxide, Titanium Oxide, Barium Strontium Titanium Oxide, Barium Titanium Oxide, Strontium Titanium Oxide, Yttrium Oxide, Aluminum Oxide, Lead Scandium Tantalum Oxide, and Lead Zinc Niobate. In some implementations, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer. Further metal layers may be included for other purposes, such as a barrier layer.

For a PMOS transistor, metals that may be used for the gate electrode include, but are not limited to, Ruthenium, Palladium, Platinum, Cobalt, Nickel, and conductive metal oxides, e.g., Ruthenium Oxide. A P-type metal layer will enable the formation of a PMOS gate electrode with a workfunction that is between about 4.9 eV and about 5.2 eV. For an NMOS transistor, metals that may be used for the gate electrode include, but are not limited to, Hafnium, Zirconium, Titanium, Tantalum, Aluminum, alloys of these metals, and carbides of these metals such as Hafnium Carbide, Zirconium Carbide, Titanium Carbide, Tantalum Carbide, and Aluminum Carbide. An N-type metal layer will enable the formation of an NMOS gate electrode with a workfunction that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as Silicon Nitride, Silicon Oxide, Silicon Carbide, Silicon Nitride doped with Carbon, and Silicon Oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

In implementations, source and drain regions are formed within the substrate adjacent to the gate stack of each MOS transistor. The source and drain regions may be formed using either an implantation/diffusion process or an etching/deposition process. In the former process, dopants such as Boron, Aluminum, Antimony, Phosphorous, or Arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a Silicon alloy such as Silicon Germanium or Silicon Carbide. In some implementations, the epitaxially deposited silicon alloy may be doped in situ with dopants such as Boron, Arsenic, or Phosphorous. In further implementations, the source and drain regions may be formed using one or more alternate semiconductor materials such as germanium or a group III-V material or alloy. In further implementations, one or more layers of metal and/or metal alloys may be used to form the source and drain regions.

In other implementations, one or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, Silicon Dioxide ($SiO_2$), Carbon doped oxide (CDO), Silicon Nitride, organic polymers such as Perfluorocyclobutane or Polytetrafluoroethylene, Fluorosilicate glass (FSG), and organosilicates such as Silsesquioxane, Siloxane, or Organosilicate glass. The ILD layers may include pores or air gaps to further reduce their dielectric constant.

What is claimed is:

1. An integrated circuit die comprising:
    a cladding layer; and
    a red light emitting diode (LED) comprising an Indium Gallium Nitride (InGaN) layer disposed above the cladding layer and having a power efficiency greater than 10 lumens per Watt (lm/W).

2. The integrated circuit die of claim 1, wherein the red LED is a micro pyramid LED.

3. The integrated circuit die of claim 1, wherein the red LED is a nanowire LED.

4. The integrated circuit die of claim 1, wherein the Indium Gallium Nitride (InGaN) layer has an average atomic concentration of equal to or greater than approximately 40 percent Indium.

5. An integrated circuit die comprising:
    a cladding layer; and a monolithic multi-color light emitting diode (LED) pixel disposed above the cladding layer, wherein the monolithic multi-color LED pixel comprises a blue LED, a green to LED, and a red LED, wherein the red LED comprising an Indium Gallium Nitride (InGaN) layer disposed above the cladding layer and having a power efficiency greater than 10 lumens per Watt (lm/W).

6. The integrated circuit die of claim 5, wherein the blue LED, the green LED, and the red LED are micro pyramid LEDs.

7. The integrated circuit die of claim 5, wherein the blue LED, the green LED, and the red LED are nanowire LEDs.

8. The integrated circuit die of claim 5, further comprising:
   a conductive contact shared by the blue LED, the green LED, and the red LED, and to connect a supply voltage to the monolithic multi-color (LED) pixel.

9. The integrated circuit die of claim 5, further comprising:
   a protective layer disposed around sides of the blue LED, the green LED, and the red LED.

10. The integrated circuit die of claim 5, wherein the Indium Gallium Nitride (InGaN) layer of the red LED has an average concentration of equal to or greater than approximately 40 percent Indium.

* * * * *